United States Patent
Yoo et al.

(10) Patent No.: US 9,761,790 B2
(45) Date of Patent: Sep. 12, 2017

(54) STRETCH FRAME FOR STRETCHING PROCESS

(71) Applicant: Parker-Hannifin Corporation, Cleveland, OH (US)

(72) Inventors: Mikyong Yoo, Palo Alto, CA (US); Hooman Mousavi Nazari, Dale City, CA (US); Xina Quan, Saratoga, CA (US)

(73) Assignee: PARKER-HANNIFIN CORPORATION, Cleveland, OH (US)

( * ) Notice: Subject to any disclaimer, the term of this patent is extended or adjusted under 35 U.S.C. 154(b) by 174 days.

(21) Appl. No.: 14/391,231

(22) PCT Filed: Jun. 18, 2013

(86) PCT No.: PCT/US2013/046248
§ 371 (c)(1),
(2) Date: Oct. 8, 2014

(87) PCT Pub. No.: WO2013/192143
PCT Pub. Date: Dec. 27, 2013

(65) Prior Publication Data
US 2015/0096666 A1 Apr. 9, 2015

Related U.S. Application Data

(60) Provisional application No. 61/660,887, filed on Jun. 18, 2012.

(51) Int. Cl.
*H01L 41/33* (2013.01)
*H01L 41/45* (2013.01)
(Continued)

(52) U.S. Cl.
CPC .............. *H01L 41/33* (2013.01); *B32B 37/12* (2013.01); *B32B 37/24* (2013.01);
(Continued)

(58) Field of Classification Search
CPC ....... H01L 41/45; H01L 41/33; H01L 41/193; H01L 41/0805; Y10T 428/2896;
(Continued)

(56) References Cited

U.S. PATENT DOCUMENTS 2,430,013 A 11/1947 Hansell
2,967,914 A 1/1961 Pye
(Continued)

FOREIGN PATENT DOCUMENTS

CA 2329804 A1 11/1999
CA 2330384 A1 11/1999
(Continued)

OTHER PUBLICATIONS

International Search Report for PCT/US2013/046248, dated Nov. 15, 2013 (7 pages).
(Continued)

*Primary Examiner* — Vishal I Patel
(74) *Attorney, Agent, or Firm* — K&L Gates LLP

(57) ABSTRACT

An apparatus comprising a frame and a pressure sensitive adhesive applied to at least a portion of the frame, where the pressure sensitive adhesive is arranged to bond a pre-strained film to the frame is disclosed. A method of making the apparatus also is disclosed. Also disclosed is a method of preparing a stretch frame for manufacturing electroactive polymer devices thereon.

5 Claims, 10 Drawing Sheets

(51) Int. Cl.
*B32B 37/12* (2006.01)
*B32B 37/24* (2006.01)
*B32B 38/00* (2006.01)
*H01L 41/08* (2006.01)
*H01L 41/193* (2006.01)
*H04R 17/00* (2006.01)

(52) U.S. Cl.
CPC ...... *B32B 38/0012* (2013.01); *H01L 41/0805* (2013.01); *H01L 41/193* (2013.01); *H01L 41/45* (2013.01); *H04R 17/005* (2013.01); *B32B 2037/243* (2013.01); *B32B 2038/0028* (2013.01); *Y10T 428/28* (2015.01); *Y10T 428/287* (2015.01); *Y10T 428/2826* (2015.01); *Y10T 428/2839* (2015.01); *Y10T 428/2878* (2015.01); *Y10T 428/2891* (2015.01); *Y10T 428/2896* (2015.01)

(58) Field of Classification Search
CPC ............. Y10T 428/28; Y10T 428/2826; Y10T 428/2839; Y10T 428/287; Y10T 428/2878; Y10T 428/2891; H04R 17/005; B32B 2037/243; B32B 38/0012; B32B 37/24; B32B 2038/0028; B32B 37/12
See application file for complete search history.

(56) References Cited

U.S. PATENT DOCUMENTS

| | | |
|---|---|---|
| 3,050,034 A | 8/1962 | Benton |
| 3,056,932 A | 10/1962 | Wood |
| 3,303,750 A | 2/1967 | Powell |
| 3,304,773 A | 2/1967 | Rogallo |
| 3,400,281 A | 9/1968 | Malik |
| 3,403,234 A | 9/1968 | Barnes, Jr. et al. |
| 3,463,942 A | 8/1969 | Mellon |
| 3,509,714 A | 5/1970 | Walton |
| 3,516,846 A | 6/1970 | Matson |
| 3,539,841 A | 11/1970 | Riff |
| 3,558,936 A | 1/1971 | Horan |
| 3,606,241 A | 9/1971 | Bornholdt |
| 3,699,963 A | 10/1972 | Zaffaroni |
| 3,783,480 A | 1/1974 | Booe |
| 3,798,473 A | 3/1974 | Murayama et al. |
| 3,801,839 A | 4/1974 | Yo |
| 3,816,774 A | 6/1974 | Ohnuki et al. |
| 3,821,967 A | 7/1974 | Sturman et al. |
| 3,832,580 A | 8/1974 | Yamamuro et al. |
| 3,851,363 A | 12/1974 | Booe |
| 3,903,733 A | 9/1975 | Murayama et al. |
| 3,935,485 A | 1/1976 | Yoshida et al. |
| 3,940,637 A | 2/1976 | Ohigashi et al. |
| 3,943,614 A | 3/1976 | Yoshikawa et al. |
| 3,947,644 A | 3/1976 | Uchikawa |
| 3,965,757 A | 6/1976 | Barrus |
| 4,011,474 A | 3/1977 | O'Neill |
| 4,028,566 A | 6/1977 | Franssen et al. |
| 4,051,395 A | 9/1977 | Taylor |
| 4,056,742 A | 11/1977 | Tibbetts |
| 4,088,915 A | 5/1978 | Kodama |
| 4,089,927 A | 5/1978 | Taylor |
| 4,127,749 A | 11/1978 | Atoji et al. |
| 4,140,936 A | 2/1979 | Bullock |
| 4,155,950 A | 5/1979 | Berezuk et al. |
| 4,158,787 A | 6/1979 | Forward |
| 4,170,742 A | 10/1979 | Itagaki et al. |
| 4,190,336 A | 2/1980 | Frank et al. |
| 4,216,403 A | 8/1980 | Krempl et al. |
| 4,227,347 A | 10/1980 | Tam |
| 4,234,813 A | 11/1980 | Iguchi et al. |
| 4,236,416 A | 12/1980 | Barcita |
| 4,240,535 A | 12/1980 | Pierce et al. |
| 4,245,815 A | 1/1981 | Willis |
| 4,257,594 A | 3/1981 | Conrey et al. |
| 4,266,339 A | 5/1981 | Kalt |
| 4,283,461 A | 8/1981 | Wooden et al. |
| 4,283,649 A | 8/1981 | Heinouchi |
| 4,284,921 A | 8/1981 | Lemonon et al. |
| 4,290,983 A | 9/1981 | Sasaki et al. |
| 4,297,394 A | 10/1981 | Wooden et al. |
| 4,315,433 A | 2/1982 | Edelman et al. |
| 4,322,877 A | 4/1982 | Taylor |
| 4,326,762 A | 4/1982 | Hockenbrock et al. |
| 4,330,730 A | 5/1982 | Kurz et al. |
| 4,342,936 A | 8/1982 | Marcus et al. |
| 4,344,743 A | 8/1982 | Bessman et al. |
| 4,346,505 A | 8/1982 | Lemonon et al. |
| 4,363,991 A | 12/1982 | Edelman |
| 4,373,525 A | 2/1983 | Kobayashi |
| 4,376,302 A | 3/1983 | Miller |
| 4,384,394 A | 5/1983 | Lemonon et al. |
| 4,387,318 A | 6/1983 | Kolm et al. |
| 4,400,634 A | 8/1983 | Micheron |
| 4,401,911 A | 8/1983 | Ravinet et al. |
| 4,404,490 A | 9/1983 | Taylor et al. |
| 4,413,202 A | 11/1983 | Krempl et al. |
| 4,433,359 A | 2/1984 | Hamabe et al. |
| 4,434,452 A | 2/1984 | Hamabe et al. |
| 4,435,667 A | 3/1984 | Kolm et al. |
| 4,442,372 A | 4/1984 | Roberts |
| 4,469,920 A | 9/1984 | Murphy |
| 4,469,978 A | 9/1984 | Hamada et al. |
| 4,472,255 A | 9/1984 | Millington et al. |
| 4,473,806 A | 9/1984 | Johnston |
| 4,500,377 A | 2/1985 | Broussoux et al. |
| 4,518,555 A | 5/1985 | Ravinet et al. |
| 4,561,830 A | 12/1985 | Bradley |
| 4,566,135 A | 1/1986 | Schmidt |
| 4,588,998 A | 5/1986 | Yamamuro et al. |
| 4,592,383 A | 6/1986 | Rikuta |
| 4,594,058 A | 6/1986 | Fischell |
| 4,595,338 A | 6/1986 | Kolm et al. |
| 4,598,338 A | 7/1986 | Van Devender et al. |
| 4,605,167 A | 8/1986 | Maehara |
| 4,626,730 A | 12/1986 | Hubbard, Jr. |
| 4,638,207 A | 1/1987 | Radice |
| 4,654,554 A | 3/1987 | Kishi |
| 4,668,449 A | 5/1987 | Soni et al. |
| 4,671,792 A | 6/1987 | Borsanyi |
| 4,678,955 A | 7/1987 | Toda |
| 4,686,440 A | 8/1987 | Hatamura et al. |
| 4,689,614 A | 8/1987 | Strachan |
| 4,704,556 A | 11/1987 | Kay |
| 4,715,396 A | 12/1987 | Fox |
| 4,728,265 A | 3/1988 | Cannon |
| 4,733,121 A | 3/1988 | Hebert |
| 4,748,366 A | 5/1988 | Taylor |
| 4,762,733 A | 8/1988 | Thiel et al. |
| 4,783,888 A | 11/1988 | Fujii et al. |
| 4,784,479 A | 11/1988 | Ikemori |
| 4,785,837 A | 11/1988 | Hansen et al. |
| 4,786,837 A | 11/1988 | Kalnin et al. |
| 4,787,411 A | 11/1988 | Moldenhauer |
| 4,793,588 A | 12/1988 | Laverty, Jr. |
| 4,803,671 A | 2/1989 | Rochling et al. |
| 4,808,084 A | 2/1989 | Tsubouchi et al. |
| 4,814,661 A | 3/1989 | Ratzlaff et al. |
| 4,820,236 A | 4/1989 | Berliner et al. |
| 4,824,107 A | 4/1989 | French |
| 4,825,116 A | 4/1989 | Itoh et al. |
| 4,833,659 A | 5/1989 | Geil et al. |
| 4,835,747 A | 5/1989 | Billet |
| 4,839,872 A | 6/1989 | Gragnolati et al. |
| 4,843,275 A | 6/1989 | Radice |
| 4,849,668 A | 7/1989 | Crawley et al. |
| 4,868,447 A | 9/1989 | Lee et al. |
| 4,869,282 A | 9/1989 | Sittler et al. |
| 4,870,868 A | 10/1989 | Gastgeb et al. |
| 4,877,957 A | 10/1989 | Okada et al. |
| 4,877,988 A | 10/1989 | McGinniss et al. |
| 4,879,698 A | 11/1989 | Langberg |
| 4,885,783 A | 12/1989 | Whitehead et al. |

(56) References Cited

U.S. PATENT DOCUMENTS

| | | |
|---|---|---|
| 4,885,830 A | 12/1989 | Ohtaka |
| 4,904,222 A | 2/1990 | Gastgeb et al. |
| 4,906,886 A | 3/1990 | Breimesser et al. |
| 4,911,057 A | 3/1990 | Fishman |
| 4,911,995 A | 3/1990 | Belanger et al. |
| 4,958,100 A | 9/1990 | Crawley et al. |
| 4,961,956 A | 10/1990 | Simopoulos et al. |
| 4,969,197 A | 11/1990 | Takaya |
| 4,971,287 A | 11/1990 | Shaw |
| 4,980,597 A | 12/1990 | Iwao |
| 4,989,951 A | 2/1991 | Miyano et al. |
| 5,024,872 A | 6/1991 | Wilson et al. |
| RE33,651 E | 7/1991 | Blonder et al. |
| 5,030,874 A | 7/1991 | Saito et al. |
| 5,048,791 A | 9/1991 | Ellison et al. |
| 5,065,067 A | 11/1991 | Todd et al. |
| 5,076,538 A | 12/1991 | Mohr et al. |
| 5,085,401 A | 2/1992 | Botting et al. |
| 5,090,246 A | 2/1992 | Colla et al. |
| 5,090,794 A | 2/1992 | Hatano et al. |
| 5,100,100 A | 3/1992 | Benson et al. |
| 5,103,211 A | 4/1992 | Daoud et al. |
| 5,119,840 A | 6/1992 | Shibata |
| 5,132,582 A | 7/1992 | Hayashi et al. |
| 5,142,510 A | 8/1992 | Rodda |
| 5,148,735 A | 9/1992 | Veletovac |
| 5,149,514 A | 9/1992 | Sanjurjo |
| 5,153,820 A | 10/1992 | MacFarlane et al. |
| 5,153,859 A | 10/1992 | Chatigny et al. |
| 5,156,885 A | 10/1992 | Budd |
| 5,170,089 A | 12/1992 | Fulton |
| 5,171,734 A | 12/1992 | Sanjurjo et al. |
| 5,172,024 A | 12/1992 | Broussoux et al. |
| 5,188,447 A | 2/1993 | Chiang et al. |
| 5,192,197 A | 3/1993 | Culp |
| 5,199,641 A | 4/1993 | Hohm et al. |
| 5,206,557 A | 4/1993 | Bobbio |
| 5,217,355 A | 6/1993 | Hyman et al. |
| 5,229,979 A | 7/1993 | Scheinbeim et al. |
| 5,232,196 A | 8/1993 | Hutchings et al. |
| 5,240,004 A | 8/1993 | Walinsky et al. |
| 5,244,707 A | 9/1993 | Shores |
| 5,250,784 A | 10/1993 | Muller et al. |
| 5,254,296 A | 10/1993 | Perlman |
| 5,258,201 A | 11/1993 | Munn et al. |
| 5,281,885 A | 1/1994 | Watanabe et al. |
| 5,288,551 A | 2/1994 | Sato et al. |
| 5,291,335 A | 3/1994 | Ogino |
| 5,302,318 A | 4/1994 | Dutta et al. |
| 5,305,178 A | 4/1994 | Binder et al. |
| 5,321,332 A | 6/1994 | Toda |
| 5,350,966 A | 9/1994 | Culp |
| 5,352,574 A | 10/1994 | Guiseppi-Elie |
| 5,356,500 A | 10/1994 | Scheinbeim et al. |
| 5,361,240 A | 11/1994 | Pearce |
| 5,368,704 A | 11/1994 | Madou et al. |
| 5,369,995 A | 12/1994 | Scheinbeim et al. |
| 5,377,258 A | 12/1994 | Bro |
| 5,380,396 A | 1/1995 | Shikida et al. |
| 5,410,210 A | 4/1995 | Sato et al. |
| 5,417,235 A | 5/1995 | Wise et al. |
| 5,424,596 A | 6/1995 | Mendenhall et al. |
| 5,428,523 A | 6/1995 | McDonnal |
| 5,430,565 A | 7/1995 | Yamanouchi et al. |
| 5,438,553 A | 8/1995 | Wilson et al. |
| 5,440,194 A | 8/1995 | Beurrier |
| 5,452,878 A | 9/1995 | Gravesen et al. |
| 5,481,152 A | 1/1996 | Bushulte |
| 5,488,872 A | 2/1996 | McCormick |
| 5,493,372 A | 2/1996 | Mashtare et al. |
| 5,495,137 A | 2/1996 | Park et al. |
| 5,499,127 A | 3/1996 | Tsubota et al. |
| 5,500,635 A | 3/1996 | Mott |
| 5,504,388 A | 4/1996 | Kimura et al. |
| 5,509,888 A | 4/1996 | Miller |
| 5,515,341 A | 5/1996 | Toda et al. |
| 5,548,177 A | 8/1996 | Carroll |
| 5,559,387 A | 9/1996 | Beurrier |
| 5,563,466 A | 10/1996 | Rennex et al. |
| 5,571,148 A | 11/1996 | Loeb et al. |
| 5,578,889 A | 11/1996 | Epstein |
| 5,589,725 A | 12/1996 | Haertling |
| 5,591,986 A | 1/1997 | Niigaki et al. |
| 5,593,462 A | 1/1997 | Gueguen et al. |
| 5,630,709 A | 5/1997 | Bar-Cohen |
| 5,632,841 A | 5/1997 | Hellbaum et al. |
| 5,636,072 A | 6/1997 | Shibata et al. |
| 5,636,100 A | 6/1997 | Zheng et al. |
| 5,642,015 A | 6/1997 | Whitehead et al. |
| 5,647,245 A | 7/1997 | Takei |
| 5,668,703 A | 9/1997 | Rossi et al. |
| 5,678,571 A | 10/1997 | Brown |
| 5,682,075 A | 10/1997 | Bolleman et al. |
| 5,684,637 A | 11/1997 | Floyd |
| 5,696,663 A | 12/1997 | Unami et al. |
| 5,703,295 A | 12/1997 | Ishida et al. |
| 5,717,563 A | 2/1998 | MacDougall et al. |
| 5,722,418 A | 3/1998 | Bro |
| 5,744,908 A | 4/1998 | Kyushima |
| 5,751,090 A | 5/1998 | Henderson |
| 5,755,909 A | 5/1998 | Gailus |
| 5,761,782 A | 6/1998 | Sager |
| 5,766,934 A | 6/1998 | Guiseppi-Elie |
| 5,777,540 A | 7/1998 | Dedert et al. |
| 5,788,468 A | 8/1998 | Dewa et al. |
| 5,798,600 A | 8/1998 | Sager et al. |
| 5,800,421 A | 9/1998 | Lemelson |
| 5,801,475 A | 9/1998 | Kimura |
| 5,814,921 A | 9/1998 | Carroll |
| 5,828,157 A | 10/1998 | Miki et al. |
| 5,831,371 A | 11/1998 | Bishop |
| 5,835,453 A | 11/1998 | Wynne et al. |
| 5,847,690 A | 12/1998 | Boie et al. |
| 5,857,694 A | 1/1999 | Lazarus et al. |
| 5,876,675 A | 3/1999 | Kennedy |
| 5,883,466 A | 3/1999 | Suyama et al. |
| 5,889,354 A | 3/1999 | Sager |
| 5,892,314 A | 4/1999 | Sager et al. |
| 5,896,287 A | 4/1999 | Mihara et al. |
| 5,897,097 A | 4/1999 | Biegelsen et al. |
| 5,900,572 A | 5/1999 | Aaroe |
| 5,902,836 A | 5/1999 | Bennett et al. |
| 5,910,107 A | 6/1999 | Iliff |
| 5,912,499 A | 6/1999 | Diem et al. |
| 5,913,310 A | 6/1999 | Brown |
| 5,914,901 A | 6/1999 | Pascucci |
| 5,915,377 A | 6/1999 | Coffee |
| 5,918,502 A | 7/1999 | Bishop |
| 5,928,262 A | 7/1999 | Harber |
| 5,928,547 A | 7/1999 | Shea et al. |
| 5,933,170 A | 8/1999 | Takeuchi et al. |
| 5,961,298 A | 10/1999 | Bar-Cohen et al. |
| 5,964,583 A | 10/1999 | Danby |
| 5,971,355 A | 10/1999 | Biegelsen et al. |
| 5,977,685 A | 11/1999 | Kurita et al. |
| 5,984,760 A | 11/1999 | Marine |
| 5,988,902 A | 11/1999 | Holehan |
| 6,012,961 A | 1/2000 | Sharpe, III et al. |
| 6,037,707 A | 3/2000 | Gailus et al. |
| 6,040,356 A | 3/2000 | Kanki et al. |
| 6,048,276 A | 4/2000 | Vandergrift |
| 6,048,622 A | 4/2000 | Hagood, IV et al. |
| 6,055,859 A | 5/2000 | Kozuka et al. |
| 6,059,546 A | 5/2000 | Brenan et al. |
| 6,060,811 A | 5/2000 | Fox et al. |
| 6,069,420 A | 5/2000 | Mizzi et al. |
| 6,074,178 A | 6/2000 | Bishop et al. |
| 6,074,179 A | 6/2000 | Jokela et al. |
| 6,075,504 A | 6/2000 | Stoller |
| 6,078,126 A | 6/2000 | Rollins et al. |
| 6,084,321 A | 7/2000 | Hunter et al. |
| 6,089,701 A | 7/2000 | Hashizume et al. |
| 6,093,078 A | 7/2000 | Cook |
| 6,093,995 A | 7/2000 | Lazarus et al. |

(56) References Cited

U.S. PATENT DOCUMENTS

| | | |
|---|---|---|
| 6,094,988 A | 8/2000 | Aindow |
| 6,097,821 A | 8/2000 | Yokoyama et al. |
| 6,108,275 A | 8/2000 | Hughes et al. |
| 6,111,743 A | 8/2000 | Lavene |
| 6,117,396 A | 9/2000 | Demers |
| 6,130,510 A | 10/2000 | Kurihara et al. |
| 6,133,398 A | 10/2000 | Bhat et al. |
| 6,140,131 A | 10/2000 | Sunakawa et al. |
| 6,140,740 A | 10/2000 | Porat et al. |
| 6,140,746 A | 10/2000 | Miyashita et al. |
| 6,148,842 A | 11/2000 | Kappel et al. |
| 6,156,842 A | 12/2000 | Hoenig et al. |
| 6,157,528 A | 12/2000 | Anthony |
| 6,161,966 A | 12/2000 | Chang et al. |
| 6,165,126 A | 12/2000 | Merzenich et al. |
| 6,168,133 B1 | 1/2001 | Heinz et al. |
| 6,181,351 B1 | 1/2001 | Merrill et al. |
| 6,184,044 B1 | 2/2001 | Sone et al. |
| 6,184,608 B1 | 2/2001 | Cabuz et al. |
| 6,184,609 B1 | 2/2001 | Johansson et al. |
| 6,184,844 B1 | 2/2001 | Filipovic et al. |
| 6,190,805 B1 | 2/2001 | Takeuchi et al. |
| 6,194,815 B1 | 2/2001 | Carroll |
| 6,196,935 B1 | 3/2001 | Spangler et al. |
| 6,198,203 B1 | 3/2001 | Hotomi |
| 6,198,204 B1 | 3/2001 | Pottenger |
| 6,201,398 B1 | 3/2001 | Takada |
| 6,210,827 B1 | 4/2001 | Dopp et al. |
| 6,228,533 B1 | 5/2001 | Ohashi et al. |
| 6,232,702 B1 | 5/2001 | Newnham et al. |
| 6,239,535 B1 | 5/2001 | Toda et al. |
| 6,239,536 B1 | 5/2001 | Lakin |
| 6,240,814 B1 | 6/2001 | Boyd et al. |
| 6,248,262 B1 | 6/2001 | Kubotera et al. |
| 6,249,076 B1 | 6/2001 | Madden et al. |
| 6,252,221 B1 | 6/2001 | Kaneko et al. |
| 6,252,334 B1 | 6/2001 | Nye et al. |
| 6,252,336 B1 | 6/2001 | Hall |
| 6,255,758 B1 | 7/2001 | Cabuz et al. |
| 6,262,516 B1 | 7/2001 | Fukuda et al. |
| 6,268,219 B1 | 7/2001 | McBride et al. |
| 6,282,074 B1 | 8/2001 | Anthony |
| 6,284,435 B1 | 9/2001 | Cao |
| 6,286,961 B1 | 9/2001 | Ogawa |
| 6,291,155 B1 | 9/2001 | Raguse et al. |
| 6,291,928 B1 | 9/2001 | Lazarus et al. |
| 6,294,859 B1 | 9/2001 | Jaenker |
| 6,297,579 B1 | 10/2001 | Martin et al. |
| 6,311,950 B1 | 11/2001 | Kappel et al. |
| 6,316,084 B1 | 11/2001 | Claus et al. |
| 6,321,428 B1 | 11/2001 | Toda et al. |
| 6,330,463 B1 | 12/2001 | Hedrich |
| 6,333,595 B1 | 12/2001 | Horikawa et al. |
| 6,334,673 B1 | 1/2002 | Kitahara et al. |
| 6,336,367 B1 | 1/2002 | Raeisaenen |
| 6,336,880 B1 | 1/2002 | Agner |
| 6,339,527 B1 | 1/2002 | Farooq et al. |
| 6,343,129 B1 | 1/2002 | Pelrine et al. |
| 6,345,840 B1 | 2/2002 | Meyer et al. |
| 6,349,141 B1 | 2/2002 | Corsaro |
| 6,355,185 B1 | 3/2002 | Kubota |
| 6,358,021 B1 | 3/2002 | Cabuz |
| 6,359,370 B1 | 3/2002 | Chang |
| 6,366,193 B2 | 4/2002 | Duggal et al. |
| 6,369,954 B1 | 4/2002 | Berge et al. |
| 6,375,857 B1 | 4/2002 | Ng et al. |
| 6,376,971 B1 | 4/2002 | Pelrine et al. |
| 6,377,383 B1 | 4/2002 | Whitehead et al. |
| 6,379,393 B1 | 4/2002 | Marvroidis et al. |
| 6,379,809 B1 | 4/2002 | Simpson et al. |
| 6,385,021 B1 | 5/2002 | Takeda et al. |
| 6,385,429 B1 | 5/2002 | Weber et al. |
| 6,388,043 B1 | 5/2002 | Langer et al. |
| 6,388,553 B1 | 5/2002 | Shea et al. |
| 6,388,856 B1 | 5/2002 | Anthony |
| 6,400,065 B1 | 6/2002 | Toda et al. |
| 6,404,107 B1 | 6/2002 | Lazarus et al. |
| 6,411,009 B2 | 6/2002 | Jaenker |
| 6,411,013 B1 | 6/2002 | Horning |
| 6,424,079 B1 | 7/2002 | Carroll |
| 6,429,573 B2 | 8/2002 | Koopmann et al. |
| 6,429,576 B1 | 8/2002 | Simes |
| 6,433,689 B1 | 8/2002 | Hovind et al. |
| 6,434,245 B1 | 8/2002 | Zimmermann |
| 6,435,840 B1 | 8/2002 | Sharma et al. |
| 6,436,531 B1 | 8/2002 | Kollaja et al. |
| 6,437,489 B1 | 8/2002 | Shinke et al. |
| 6,457,697 B1 | 10/2002 | Kolze |
| 6,459,088 B1 | 10/2002 | Yasuda et al. |
| 6,471,185 B2 | 10/2002 | Lewin et al. |
| 6,475,931 B2 | 11/2002 | Bower et al. |
| 6,486,589 B1 | 11/2002 | Dujari et al. |
| 6,492,762 B1 | 12/2002 | Pant et al. |
| 6,495,945 B2 | 12/2002 | Yamaguchi et al. |
| 6,499,509 B2 | 12/2002 | Berger et al. |
| 6,502,803 B1 | 1/2003 | Mattes |
| 6,504,286 B1 | 1/2003 | Porat et al. |
| 6,509,802 B2 | 1/2003 | Kasperkovitz |
| 6,514,237 B1 | 2/2003 | Maseda |
| 6,522,516 B2 | 2/2003 | Anthony |
| 6,523,560 B1 | 2/2003 | Williams et al. |
| 6,528,925 B1 | 3/2003 | Takeuchi et al. |
| 6,528,928 B1 | 3/2003 | Burns et al. |
| 6,530,266 B1 | 3/2003 | Adderton et al. |
| 6,532,145 B1 | 3/2003 | Carlen et al. |
| 6,540,893 B1 | 4/2003 | Wakida et al. |
| 6,543,110 B1 | 4/2003 | Pelrine et al. |
| 6,545,384 B1 | 4/2003 | Pelrine et al. |
| 6,562,513 B1 | 5/2003 | Takeuchi et al. |
| 6,583,533 B2 | 6/2003 | Pelrine et al. |
| 6,586,859 B2 | 7/2003 | Kornbluh et al. |
| 6,590,267 B1 | 7/2003 | Goodwin-Johansson et al. |
| 6,593,155 B2 | 7/2003 | Mohler et al. |
| 6,613,816 B2 | 9/2003 | Mahdi et al. |
| 6,617,759 B1 | 9/2003 | Zumeris et al. |
| 6,617,765 B1 | 9/2003 | Lagier et al. |
| 6,619,799 B1 | 9/2003 | Blum et al. |
| 6,628,040 B2 | 9/2003 | Pelrine et al. |
| 6,631,068 B1 | 10/2003 | Lobo |
| 6,637,276 B2 | 10/2003 | Adderton et al. |
| 6,640,402 B1 | 11/2003 | Vooren et al. |
| 6,644,027 B1 | 11/2003 | Kelly |
| 6,646,077 B1 | 11/2003 | Lyons |
| 6,650,455 B2 | 11/2003 | Miles |
| 6,652,938 B1 | 11/2003 | Nishikawa et al. |
| 6,654,004 B2 | 11/2003 | Hoggarth |
| 6,664,718 B2 | 12/2003 | Pelrine et al. |
| 6,668,109 B2 | 12/2003 | Nahum et al. |
| 6,673,533 B1 | 1/2004 | Wohlstadter et al. |
| 6,680,825 B1 | 1/2004 | Murphy et al. |
| 6,682,500 B2 | 1/2004 | Soltanpour et al. |
| 6,685,442 B2 | 2/2004 | Chinn et al. |
| 6,690,101 B2 | 2/2004 | Magnussen et al. |
| 6,700,314 B2 | 3/2004 | Cuhat et al. |
| 6,701,296 B1 | 3/2004 | Kramer et al. |
| 6,707,236 B2 | 3/2004 | Pelrine et al. |
| 6,720,710 B1 | 4/2004 | Wenzel et al. |
| 6,733,130 B2 | 5/2004 | Blum et al. |
| 6,743,273 B2 | 6/2004 | Chung et al. |
| 6,762,050 B2 | 7/2004 | Fukushima et al. |
| 6,768,246 B2 | 7/2004 | Pelrine et al. |
| 6,781,284 B1 | 8/2004 | Pelrine et al. |
| 6,784,227 B2 | 8/2004 | Simon et al. |
| 6,791,205 B2 | 9/2004 | Woodbridge |
| 6,796,639 B2 | 9/2004 | Sugahara |
| 6,800,155 B2 | 10/2004 | Senecal et al. |
| 6,804,068 B2 | 10/2004 | Sasaki et al. |
| 6,806,621 B2 | 10/2004 | Heim et al. |
| 6,806,806 B2 | 10/2004 | Anthony |
| 6,806,808 B1 | 10/2004 | Watters et al. |
| 6,809,462 B2 | 10/2004 | Pelrine et al. |
| 6,809,928 B2 | 10/2004 | Gwin et al. |
| 6,812,624 B1 | 11/2004 | Pei et al. |
| 6,824,689 B2 | 11/2004 | Wang et al. |

(56) References Cited

U.S. PATENT DOCUMENTS

| | | |
|---|---|---|
| 6,847,153 B1 | 1/2005 | Balizer |
| 6,847,155 B2 | 1/2005 | Schwartz et al. |
| 6,856,305 B2 | 2/2005 | Nagano |
| 6,864,592 B1 | 3/2005 | Kelly |
| 6,866,242 B2 | 3/2005 | Hirota |
| 6,867,533 B1 | 3/2005 | Su et al. |
| 6,869,275 B2 | 3/2005 | Dante et al. |
| 6,876,125 B2 | 4/2005 | Basheer et al. |
| 6,876,135 B2 | 4/2005 | Pelrine et al. |
| 6,879,318 B1 | 4/2005 | Chan et al. |
| 6,882,086 B2 | 4/2005 | Kornbluh et al. |
| 6,891,317 B2 | 5/2005 | Pei et al. |
| 6,902,048 B1 | 6/2005 | Chung |
| 6,911,764 B2 | 6/2005 | Pelrine et al. |
| 6,935,287 B2 | 8/2005 | Shinogle |
| 6,938,945 B2 | 9/2005 | Wald et al. |
| 6,940,211 B2 | 9/2005 | Pelrine et al. |
| 6,940,212 B2 | 9/2005 | Mueller |
| 6,940,221 B2 | 9/2005 | Matsukiyo et al. |
| 6,944,931 B2 | 9/2005 | Shcheglov et al. |
| 6,952,313 B2 | 10/2005 | Schrader |
| 6,967,430 B2 | 11/2005 | Johansson |
| 6,994,314 B2 | 2/2006 | Garnier et al. |
| 6,997,870 B2 | 2/2006 | Couvillon, Jr. |
| 7,008,838 B1 | 3/2006 | Hosking et al. |
| 7,011,378 B2 | 3/2006 | Maluf et al. |
| 7,011,760 B2 | 3/2006 | Wang et al. |
| 7,029,056 B2 | 4/2006 | Browne et al. |
| 7,034,432 B1 | 4/2006 | Pelrine et al. |
| 7,037,270 B2 | 5/2006 | Seward |
| 7,038,357 B2 | 5/2006 | Goldenberg et al. |
| 7,049,732 B2 | 5/2006 | Pei et al. |
| 7,052,594 B2 | 5/2006 | Pelrine et al. |
| 7,062,055 B2 | 6/2006 | Pelrine et al. |
| 7,063,268 B2 | 6/2006 | Chrysler et al. |
| 7,063,377 B2 | 6/2006 | Brei et al. |
| 7,064,472 B2 | 6/2006 | Pelrine et al. |
| 7,071,596 B2 | 7/2006 | Krill |
| 7,075,162 B2 | 7/2006 | Unger |
| 7,075,213 B2 | 7/2006 | Krill |
| 7,092,238 B2 | 8/2006 | Saito et al. |
| 7,099,141 B1 | 8/2006 | Kaufman et al. |
| 7,104,146 B2 | 9/2006 | Benslimane et al. |
| 7,109,643 B2 | 9/2006 | Hirai et al. |
| 7,113,318 B2 | 9/2006 | Onuki et al. |
| 7,113,848 B2 | 9/2006 | Hanson |
| 7,115,092 B2 | 10/2006 | Park et al. |
| 7,140,180 B2 | 11/2006 | Gerber et al. |
| 7,141,888 B2 | 11/2006 | Sabol et al. |
| 7,142,368 B2 | 11/2006 | Kim et al. |
| 7,142,369 B2 | 11/2006 | Wu et al. |
| 7,144,616 B1 | 12/2006 | Unger et al. |
| 7,148,789 B2 | 12/2006 | Sadler et al. |
| 7,164,212 B2 | 1/2007 | Leijon et al. |
| 7,166,952 B2 | 1/2007 | Topliss et al. |
| 7,166,953 B2 | 1/2007 | Heim et al. |
| 7,170,665 B2 | 1/2007 | Kaneko et al. |
| 7,190,016 B2 | 3/2007 | Cahalen et al. |
| 7,193,350 B1 | 3/2007 | Blackburn et al. |
| 7,195,393 B2 | 3/2007 | Potter |
| 7,195,950 B2 | 3/2007 | Taussig |
| 7,196,688 B2 | 3/2007 | Schena |
| 7,199,302 B2 | 4/2007 | Raisanen |
| 7,199,501 B2 | 4/2007 | Pei et al. |
| 7,205,704 B2 | 4/2007 | Audren et al. |
| 7,205,978 B2 | 4/2007 | Poupyrev et al. |
| 7,209,280 B2 | 4/2007 | Goossens |
| 7,211,937 B2 | 5/2007 | Kornbluh et al. |
| 7,220,785 B2 | 5/2007 | Saito |
| 7,224,106 B2 | 5/2007 | Pei et al. |
| 7,233,097 B2 | 6/2007 | Rosenthal et al. |
| 7,235,152 B2 | 6/2007 | Bell et al. |
| 7,237,524 B2 | 7/2007 | Pelrine et al. |
| 7,242,106 B2 | 7/2007 | Kelly |
| 7,242,141 B2 | 7/2007 | Pschenitzka et al. |
| 7,245,440 B2 | 7/2007 | Peseux |
| 7,256,943 B1 | 8/2007 | Kobrin et al. |
| 7,259,495 B2 | 8/2007 | Asai et al. |
| 7,259,503 B2 | 8/2007 | Pei et al. |
| 7,276,090 B2 | 10/2007 | Shahinpoor et al. |
| 7,291,512 B2 | 11/2007 | Unger |
| 7,298,054 B2 | 11/2007 | Hirsch |
| 7,298,559 B2 | 11/2007 | Kato et al. |
| 7,298,603 B2 | 11/2007 | Mizuno et al. |
| 7,301,261 B2 | 11/2007 | Ifuku et al. |
| 7,310,874 B2 | 12/2007 | Higuchi et al. |
| 7,312,917 B2 | 12/2007 | Jacob |
| 7,316,794 B2 | 1/2008 | O'Brien |
| 7,320,457 B2 | 1/2008 | Heim et al. |
| 7,321,185 B2 | 1/2008 | Schultz |
| 7,323,790 B2 | 1/2008 | Taylor et al. |
| 7,332,688 B2 | 2/2008 | Browne et al. |
| 7,339,285 B2 | 3/2008 | Negron Crespo |
| 7,339,572 B2 | 3/2008 | Schena |
| 7,342,573 B2 | 3/2008 | Ryynanen |
| 7,344,763 B2 | 3/2008 | Kokeguchi et al. |
| 7,353,747 B2 | 4/2008 | Swayze et al. |
| 7,355,293 B2 | 4/2008 | Bernhoff et al. |
| 7,359,124 B1 | 4/2008 | Fang et al. |
| 7,362,031 B2 | 4/2008 | Maita et al. |
| 7,362,032 B2 | 4/2008 | Pelrine et al. |
| 7,362,889 B2 | 4/2008 | Dubowsky et al. |
| 7,368,862 B2 | 5/2008 | Pelrine et al. |
| 7,371,596 B2 | 5/2008 | Warner, Jr. et al. |
| 7,373,454 B1 | 5/2008 | Noe |
| 7,378,783 B2 | 5/2008 | Pelrine et al. |
| 7,392,876 B2 | 7/2008 | Browne et al. |
| 7,394,182 B2 | 7/2008 | Pelrine et al. |
| 7,394,282 B2 | 7/2008 | Sinha et al. |
| 7,394,641 B2 | 7/2008 | Won et al. |
| 7,397,166 B1 | 7/2008 | Morgan et al. |
| 7,401,846 B2 | 7/2008 | Browne et al. |
| 7,411,332 B2 | 8/2008 | Kornbluh et al. |
| 7,426,340 B2 | 9/2008 | Seo |
| 7,429,074 B2 | 9/2008 | McKnight et al. |
| 7,429,495 B2 | 9/2008 | Wan |
| 7,436,099 B2 | 10/2008 | Pei et al. |
| 7,436,646 B2 | 10/2008 | Delince et al. |
| 7,442,421 B2 | 10/2008 | Li et al. |
| 7,442,760 B2 | 10/2008 | Roberts et al. |
| 7,444,072 B2 | 10/2008 | Seo |
| 7,446,926 B2 | 11/2008 | Sampsell |
| 7,449,821 B2 | 11/2008 | Dausch |
| 7,454,820 B2 | 11/2008 | Nakamura |
| 7,456,549 B2 | 11/2008 | Heim et al. |
| 7,468,575 B2 | 12/2008 | Pelrine et al. |
| 7,481,120 B2 | 1/2009 | Gravesen et al. |
| 7,482,745 B2 | 1/2009 | Shirogane et al. |
| 7,492,076 B2 | 2/2009 | Heim et al. |
| 7,498,729 B2 | 3/2009 | Ogino |
| 7,499,223 B2 | 3/2009 | Berge et al. |
| 7,511,706 B2 | 3/2009 | Schena |
| 7,513,624 B2 | 4/2009 | Yavid et al. |
| 7,515,350 B2 | 4/2009 | Berge et al. |
| 7,518,284 B2 | 4/2009 | Benslimane et al. |
| 7,521,840 B2 | 4/2009 | Heim |
| 7,521,847 B2 | 4/2009 | Heim |
| 7,537,197 B2 | 5/2009 | Heim et al. |
| 7,548,015 B2 | 6/2009 | Benslimane et al. |
| 7,548,232 B2 | 6/2009 | Shahoian et al. |
| 7,567,681 B2 | 7/2009 | Pelrine et al. |
| 7,573,064 B2 | 8/2009 | Benslimane et al. |
| 7,585,122 B2 | 9/2009 | Eromaki et al. |
| 7,586,242 B2 | 9/2009 | Yokoyama et al. |
| 7,595,580 B2 | 9/2009 | Heim |
| 7,608,989 B2 | 10/2009 | Heydt et al. |
| 7,626,319 B2 | 12/2009 | Heim |
| 7,646,544 B2 | 1/2010 | Batchko et al. |
| 7,648,118 B2 | 1/2010 | Ukpai et al. |
| 7,659,918 B2 | 2/2010 | Turner |
| 7,679,267 B2 | 3/2010 | Heim |
| 7,679,839 B2 | 3/2010 | Polyakov et al. |
| 7,690,622 B2 | 4/2010 | Ito et al. |
| 7,702,227 B2 | 4/2010 | Ito et al. |

(56) References Cited

U.S. PATENT DOCUMENTS

| | | |
|---|---|---|
| 7,703,740 B1 | 4/2010 | Franklin |
| 7,703,742 B2 | 4/2010 | Heim et al. |
| 7,703,839 B2 | 4/2010 | McKnight et al. |
| 7,705,521 B2 | 4/2010 | Pelrine et al. |
| 7,714,701 B2 | 5/2010 | Altan et al. |
| 7,732,999 B2 | 6/2010 | Clausen et al. |
| 7,733,575 B2 | 6/2010 | Heim et al. |
| 7,745,374 B2 | 6/2010 | Tanaka et al. |
| 7,750,532 B2 | 7/2010 | Heim |
| 7,750,617 B2 | 7/2010 | Omi |
| 7,761,981 B2 | 7/2010 | Rosenthal et al. |
| 7,772,745 B2 | 8/2010 | Kawakubo et al. |
| 7,785,656 B2 | 8/2010 | Pei et al. |
| 7,787,646 B2 | 8/2010 | Pelrine et al. |
| 7,813,047 B2 | 10/2010 | Wang et al. |
| 7,824,580 B2 | 11/2010 | Boll et al. |
| 7,886,993 B2 | 2/2011 | Bachmaier et al. |
| 7,893,965 B2 | 2/2011 | Heim et al. |
| 7,898,159 B2 | 3/2011 | Heydt et al. |
| 7,911,115 B2 | 3/2011 | Pelrine et al. |
| 7,911,761 B2 | 3/2011 | Biggs et al. |
| 7,915,789 B2 | 3/2011 | Smith |
| 7,915,790 B2 | 3/2011 | Heim et al. |
| 7,921,541 B2 | 4/2011 | Pei et al. |
| 7,923,064 B2 | 4/2011 | Pelrine et al. |
| 7,923,902 B2 | 4/2011 | Heim |
| 7,923,982 B2 | 4/2011 | Sumita |
| 7,940,476 B2 | 5/2011 | Polyakov et al. |
| 7,952,261 B2 | 5/2011 | Lipton et al. |
| 7,958,789 B2 | 6/2011 | Hayakawa et al. |
| 7,971,850 B2 | 7/2011 | Heim et al. |
| 7,980,671 B2 | 7/2011 | Nystrom et al. |
| 7,986,466 B2 | 7/2011 | Lee et al. |
| 7,990,022 B2 | 8/2011 | Heim |
| 7,997,260 B2 | 8/2011 | Kaakkola et al. |
| 8,004,339 B2 | 8/2011 | Barrow |
| 8,007,986 B2 | 8/2011 | Zhang et al. |
| 8,026,023 B2 | 9/2011 | Hamada |
| 8,033,324 B2 | 10/2011 | Mukasa et al. |
| 8,042,264 B2 | 10/2011 | Rosenthal et al. |
| 8,049,333 B2 | 11/2011 | Alden et al. |
| 8,050,601 B2 | 11/2011 | Lin et al. |
| 8,054,566 B2 | 11/2011 | Heim et al. |
| 8,056,618 B2 | 11/2011 | Wagner et al. |
| 8,058,861 B2 | 11/2011 | Pelrine et al. |
| 8,072,121 B2 | 12/2011 | Heim et al. |
| 8,074,939 B2 | 12/2011 | Hyde et al. |
| 8,093,783 B2 | 1/2012 | Rosenthal et al. |
| 8,127,437 B2 | 3/2012 | Lipton et al. |
| 8,133,932 B2 | 3/2012 | Kijlstra et al. |
| 8,164,835 B2 | 4/2012 | Heim et al. |
| 8,172,998 B2 | 5/2012 | Bennett et al. |
| 8,183,739 B2 | 5/2012 | Heim |
| 8,211,054 B2 | 7/2012 | Dewey |
| 8,221,944 B2 | 7/2012 | Shirasaki et al. |
| 8,222,799 B2 | 7/2012 | Polyakov et al. |
| 8,237,324 B2 | 8/2012 | Pei et al. |
| 8,248,750 B2 | 8/2012 | Biggs et al. |
| 8,258,238 B2 | 9/2012 | Boersma et al. |
| 8,283,839 B2 | 10/2012 | Heim |
| 8,294,600 B2 | 10/2012 | Peterson et al. |
| 8,310,444 B2 | 11/2012 | Peterson et al. |
| 8,316,526 B2 | 11/2012 | Pei et al. |
| 8,319,403 B2 | 11/2012 | Lipton et al. |
| 8,419,822 B2 | 4/2013 | Li |
| 8,421,316 B2 | 4/2013 | Tryson et al. |
| 8,508,109 B2 | 8/2013 | Pelrine et al. |
| 8,545,987 B2 | 10/2013 | Strader et al. |
| 8,585,007 B2 | 11/2013 | Schapeler et al. |
| 8,594,839 B2 | 11/2013 | Hanson |
| 8,679,575 B2 | 3/2014 | Biggs et al. |
| 8,679,621 B2 | 3/2014 | Blaiszik et al. |
| 8,773,373 B2 | 7/2014 | Sato et al. |
| 8,779,650 B2 | 7/2014 | Jenninger et al. |
| 8,842,355 B2 | 9/2014 | Lipton et al. |
| 8,975,888 B2 | 3/2015 | Pelrine et al. |
| 8,981,621 B2 | 3/2015 | Pelrine et al. |
| RE45,464 E | 4/2015 | Kornbluh et al. |
| 2001/0007449 A1 | 7/2001 | Kobachi et al. |
| 2002/0083858 A1 | 7/2002 | MacDiarmid et al. |
| 2003/0168936 A1 | 9/2003 | Everingham et al. |
| 2004/0014860 A1 | 1/2004 | Meier et al. |
| 2004/0035472 A1 | 2/2004 | Teltscher et al. |
| 2004/0046739 A1 | 3/2004 | Gettemy |
| 2004/0124738 A1 | 7/2004 | Pelrine et al. |
| 2004/0234401 A1 | 11/2004 | Banister |
| 2005/0002113 A1 | 1/2005 | Berge |
| 2005/0046312 A1 | 3/2005 | Miyoshi |
| 2005/0085693 A1 | 4/2005 | Belson et al. |
| 2005/0113892 A1 | 5/2005 | Sproul |
| 2005/0140922 A1 | 6/2005 | Bekerman et al. |
| 2005/0200984 A1 | 9/2005 | Browne et al. |
| 2005/0238506 A1 | 10/2005 | Mescher et al. |
| 2006/0057377 A1 | 3/2006 | Harrison et al. |
| 2006/0079619 A1 | 4/2006 | Wang et al. |
| 2006/0108416 A1 | 5/2006 | Hirai |
| 2006/0122954 A1 | 6/2006 | Podlasek et al. |
| 2006/0138371 A1 | 6/2006 | Garnier |
| 2006/0163725 A1 | 7/2006 | Haba et al. |
| 2006/0197741 A1 | 9/2006 | Biggadike |
| 2006/0238069 A1 | 10/2006 | Maruyama et al. |
| 2006/0258912 A1 | 11/2006 | Belson et al. |
| 2007/0080435 A1 | 4/2007 | Lin |
| 2007/0122132 A1 | 5/2007 | Misawa et al. |
| 2007/0152982 A1 | 7/2007 | Kim et al. |
| 2007/0170910 A1 | 7/2007 | Chang et al. |
| 2007/0173602 A1 | 7/2007 | Brinkman et al. |
| 2007/0189667 A1 | 8/2007 | Wakita et al. |
| 2007/0200457 A1 | 8/2007 | Heim et al. |
| 2007/0219285 A1 | 9/2007 | Kropp et al. |
| 2007/0230222 A1 | 10/2007 | Drabing et al. |
| 2008/0043318 A1 | 2/2008 | Whitesides et al. |
| 2008/0062589 A1 | 3/2008 | Drabing |
| 2008/0143696 A1 | 6/2008 | Goulthorpe |
| 2008/0152921 A1 | 6/2008 | Kropp |
| 2008/0191832 A1 | 8/2008 | Tsai |
| 2008/0264441 A1* | 10/2008 | Takagi .................. G03F 1/64 134/1 |
| 2008/0303782 A1 | 12/2008 | Grant et al. |
| 2009/0028491 A1 | 1/2009 | Fillion et al. |
| 2009/0050829 A1 | 2/2009 | Haynes et al. |
| 2009/0104448 A1 | 4/2009 | Thompson et al. |
| 2009/0184606 A1 | 7/2009 | Rosenthal et al. |
| 2009/0246646 A1* | 10/2009 | Hamada .................. G03F 1/64 430/5 |
| 2009/0250021 A1 | 10/2009 | Zarrabi et al. |
| 2009/0297829 A1 | 12/2009 | Pyles et al. |
| 2010/0006827 A1 | 1/2010 | Buckley |
| 2010/0236843 A1 | 9/2010 | Englund |
| 2010/0265031 A1 | 10/2010 | Yen |
| 2011/0021917 A1 | 1/2011 | Morita |
| 2011/0128239 A1 | 6/2011 | Polyakov et al. |
| 2011/0155307 A1 | 6/2011 | Pelrine et al. |
| 2011/0256383 A1 | 10/2011 | Cochet et al. |
| 2011/0285247 A1 | 11/2011 | Lipton et al. |
| 2012/0128960 A1 | 5/2012 | Büsgen |
| 2014/0014715 A1 | 1/2014 | Moran et al. |
| 2014/0176753 A1 | 6/2014 | Hillis et al. |
| 2014/0290834 A1 | 10/2014 | Egron et al. |
| 2014/0319971 A1 | 10/2014 | Yoo et al. |
| 2014/0322522 A1 | 10/2014 | Yoo |
| 2014/0352879 A1 | 12/2014 | Yoo et al. |
| 2015/0009009 A1 | 1/2015 | Zarrabi et al. |
| 2015/0034237 A1 | 2/2015 | Biggs et al. |
| 2015/0043095 A1 | 2/2015 | Lipton et al. |
| 2015/0070740 A1 | 3/2015 | Zarrabi et al. |
| 2015/0084483 A1 | 3/2015 | Yoo et al. |
| 2015/0221851 A1 | 8/2015 | Biggs et al. |
| 2015/0221852 A1 | 8/2015 | Biggs et al. |
| 2015/0221861 A1 | 8/2015 | Biggs et al. |
| 2015/0231802 A1 | 8/2015 | Quan et al. |
| 2016/0025429 A1 | 1/2016 | Muir et al. |

(56) References Cited

U.S. PATENT DOCUMENTS

| | | | |
|---|---|---|---|
| 2016/0204338 A1 | 7/2016 | Schmeer et al. | |
| 2016/0208944 A1 | 7/2016 | Muir et al. | |
| 2016/0230904 A1 | 8/2016 | Zarrabi et al. | |

FOREIGN PATENT DOCUMENTS

| | | |
|---|---|---|
| CA | 2769441 A1 | 2/2011 |
| CN | 1447365 A | 10/2003 |
| DE | 2535833 A1 | 2/1977 |
| DE | 4408618 A1 | 9/1995 |
| DE | 19636909 C1 | 3/1998 |
| DE | 19952062 A1 | 5/2000 |
| DE | 10058096 A1 | 6/2002 |
| DE | 10161349 A1 | 7/2003 |
| DE | 10335019 A1 | 2/2005 |
| EP | 0196839 A2 | 10/1986 |
| EP | 0295907 A1 | 12/1988 |
| EP | 0154473 B1 | 5/1992 |
| EP | 0522882 A2 | 1/1993 |
| EP | 0833182 A2 | 4/1998 |
| EP | 0980103 A2 | 2/2000 |
| EP | 1050955 A1 | 11/2000 |
| EP | 1090835 A1 | 4/2001 |
| EP | 1323925 A2 | 7/2004 |
| EP | 1528609 A2 | 5/2005 |
| EP | 1698876 A2 | 9/2006 |
| EP | 1843406 A1 | 10/2007 |
| EP | 1976036 A2 | 10/2008 |
| EP | 2119747 B1 | 11/2009 |
| EP | 2511314 A1 | 10/2012 |
| FR | 2208461 A5 | 6/1974 |
| FR | 2745476 A1 | 9/1997 |
| GB | 2338513 A | 12/1999 |
| GB | 2470006 A | 11/2010 |
| JP | S 5181120 A | 7/1976 |
| JP | S 52120840 A | 10/1977 |
| JP | S 5445593 A | 4/1979 |
| JP | S 5542474 A | 3/1980 |
| JP | S 5565569 A | 5/1980 |
| JP | S 5661679 A | 5/1981 |
| JP | S 56101788 A | 8/1981 |
| JP | S 59126689 A | 7/1984 |
| JP | S 6199499 A | 5/1986 |
| JP | S 61239799 A | 10/1986 |
| JP | S 6397100 A | 4/1988 |
| JP | H 02162214 A | 6/1990 |
| JP | 02222019 A | 9/1990 |
| JP | 03173022 A | 7/1991 |
| JP | H 05244782 A | 9/1993 |
| JP | H 07111785 A | 4/1995 |
| JP | H 07240544 A | 9/1995 |
| JP | H 09275688 A | 10/1997 |
| JP | H 10137655 A | 5/1998 |
| JP | H 10207616 A | 8/1998 |
| JP | H 10321482 A | 12/1998 |
| JP | H 112764 A | 1/1999 |
| JP | 11134109 A | 5/1999 |
| JP | H 11133210 A | 5/1999 |
| JP | 2000-081504 A | 3/2000 |
| JP | 2000-331874 A | 11/2000 |
| JP | 2001-130774 A | 5/2001 |
| JP | 2001-136598 A | 5/2001 |
| JP | 2001-286162 A | 10/2001 |
| JP | 2001-291906 A | 10/2001 |
| JP | 2003-040041 A | 2/2003 |
| JP | 3501216 B2 | 3/2004 |
| JP | 2004-516966 A | 6/2004 |
| JP | 2004-205827 A | 7/2004 |
| JP | 2004-221742 A | 8/2004 |
| JP | 2004-296154 A | 10/2004 |
| JP | 2004-353279 A | 12/2004 |
| JP | 2005-001885 A | 1/2005 |
| JP | 2005-202707 A | 7/2005 |
| JP | 3709723 B2 | 8/2005 |
| JP | 2005-260236 A | 9/2005 |
| JP | 2006-048302 A | 2/2006 |
| JP | 2006-509052 A | 3/2006 |
| JP | 2006-178434 A | 7/2006 |
| JP | 2006-244490 A | 9/2006 |
| JP | 2007-206362 A | 8/2007 |
| JP | 2007-287670 A | 11/2007 |
| JP | 2008-262955 A | 10/2008 |
| JP | 2008-277729 A | 11/2008 |
| JP | 2009-077618 A | 4/2009 |
| JP | 2009-249313 A | 10/2009 |
| JP | 2010-273524 A | 12/2010 |
| JP | 5415442 B2 | 2/2014 |
| KR | 2004-0097921 A | 12/2004 |
| KR | 10-0607839 B1 | 8/2006 |
| KR | 10-0650190 B1 | 11/2006 |
| KR | 2008-0100757 A | 11/2008 |
| KR | 2010-0121801 A | 11/2010 |
| KR | 20110122244 A | 11/2011 |
| TW | I1269615 B | 12/2006 |
| TW | I272194 B | 2/2007 |
| WO | WO 87/07218 A1 | 12/1987 |
| WO | WO 89/02658 A1 | 3/1989 |
| WO | WO 94/18433 A1 | 8/1994 |
| WO | WO 95/08905 A1 | 3/1995 |
| WO | WO 96/26364 A2 | 8/1996 |
| WO | WO 97/15876 A1 | 5/1997 |
| WO | WO 98/19208 A2 | 5/1998 |
| WO | WO 98/35529 A2 | 8/1998 |
| WO | WO 98/45677 A2 | 10/1998 |
| WO | WO 99/17929 A1 | 4/1999 |
| WO | WO 99/23749 A1 | 5/1999 |
| WO | WO 99/37921 A1 | 7/1999 |
| WO | WO 01/01025 A2 | 1/2001 |
| WO | WO 01/06575 A1 | 1/2001 |
| WO | WO 01/06579 A2 | 1/2001 |
| WO | WO 01/58973 A2 | 8/2001 |
| WO | WO 01/59852 A2 | 8/2001 |
| WO | WO 01/91100 A1 | 11/2001 |
| WO | WO 02/37660 A2 | 5/2002 |
| WO | WO 02/37892 A2 | 5/2002 |
| WO | WO 02/071505 A1 | 9/2002 |
| WO | WO 03/056274 A1 | 7/2003 |
| WO | WO 03/056287 A1 | 7/2003 |
| WO | WO 03/081762 A1 | 10/2003 |
| WO | WO 03/107523 A1 | 12/2003 |
| WO | WO 2004/009363 A1 | 1/2004 |
| WO | WO 2004/027970 A1 | 4/2004 |
| WO | WO 2004/053782 A1 | 6/2004 |
| WO | WO 2004/074797 A1 | 9/2004 |
| WO | WO 2004/079832 A2 | 9/2004 |
| WO | WO 2004/086289 A2 | 10/2004 |
| WO | WO 2004/093763 A1 | 11/2004 |
| WO | WO 2005/027161 A2 | 3/2005 |
| WO | WO 2005/053002 A2 | 6/2005 |
| WO | WO 2005/079187 A2 | 9/2005 |
| WO | WO 2005/079353 A2 | 9/2005 |
| WO | WO 2005/081676 A2 | 9/2005 |
| WO | WO 2005/086249 A1 | 9/2005 |
| WO | WO 2006/040532 A1 | 4/2006 |
| WO | WO 2006/071419 A2 | 7/2006 |
| WO | WO 2006/102273 A2 | 9/2006 |
| WO | WO 2006/121818 A2 | 11/2006 |
| WO | WO 2006/123317 A2 | 11/2006 |
| WO | WO 2007/018877 A2 | 2/2007 |
| WO | WO 2007/029275 A1 | 3/2007 |
| WO | WO 2007/072411 A1 | 6/2007 |
| WO | WO 2008/039658 A2 | 4/2008 |
| WO | WO 2008/052559 A2 | 5/2008 |
| WO | WO 2008/105861 A2 | 9/2008 |
| WO | WO 2008/150817 A1 | 12/2008 |
| WO | WO 2009/006318 A1 | 1/2009 |
| WO | WO 2009/056497 A1 | 5/2009 |
| WO | WO 2009/076477 A1 | 6/2009 |
| WO | WO 2009/112988 A1 | 9/2009 |
| WO | WO 2010/054014 A1 | 5/2010 |
| WO | WO 2010/104953 A1 | 9/2010 |
| WO | WO 2010/115549 A1 | 10/2010 |
| WO | WO/ 2011/097020 A2 | 8/2011 |
| WO | WO 2011/118315 A1 | 9/2011 |

(56) References Cited

FOREIGN PATENT DOCUMENTS

| | | |
|---|---|---|
| WO | WO 2012/032437 A1 | 3/2012 |
| WO | WO 2012/044419 A1 | 4/2012 |
| WO | WO 2012/099854 A1 | 7/2012 |
| WO | WO 2012/118916 A2 | 9/2012 |
| WO | WO 2012/129357 A2 | 9/2012 |
| WO | WO 2012/148644 A2 | 11/2012 |
| WO | WO 2013/044195 A2 | 3/2013 |
| WO | WO 2013/055733 A1 | 4/2013 |
| WO | WO 2013/103470 A1 | 7/2013 |
| WO | WO 2013/142552 A1 | 9/2013 |
| WO | WO 2013/155377 A1 | 10/2013 |
| WO | WO 2014/028819 A1 | 2/2014 |
| WO | WO 2014/028822 A1 | 2/2014 |
| WO | WO 2014/028825 A1 | 2/2014 |
| WO | WO 2014/062776 A1 | 4/2014 |
| WO | WO 2014/066576 A1 | 5/2014 |
| WO | WO 2014/074554 A2 | 5/2014 |
| WO | WO 2014/089388 A2 | 6/2014 |
| WO | WO 2014/187976 A1 | 11/2014 |
| WO | WO 2015/020698 A2 | 2/2015 |
| WO | WO 2015/051291 A1 | 4/2015 |
| WO | WO 2015/126928 A1 | 8/2015 |
| WO | WO 2015/126928 A4 | 12/2015 |

OTHER PUBLICATIONS

Ajluni, Cheryl, "Pressure Sensors Strive to Stay on Top, New Silicon Micromachining Techniques and Designs Promise Higher Performance," Electronic Design—Advanced Technology Series, Oct. 3, 1994, pp. 67-74.
Akle, Barbar J., et al., "Ionic Electroactive Hybrid Transducers," Smart Structures and Materials 2005: Electroactive Polymer Actuators and Devices (EAPAD), Proceedings of SPIE, Bellingham, WA, vol. 5759, 2005, pp. 153-164.
Anderson, R.A., "Mechanical Stress in a Delectric Solid From a Uniform Electric Field," The American Physical Society, 1986, pp. 1302-1307.
Aramaki, S., S. Kaneko, K. Arai, Y. Takahashi, H. Adachi, and K. Yanagisawa. 1995. "Tube Type Micro Manipulator Using Shape Memory Alloy (SMA)," Proceedings of the IEEE Sixth International Symposium on Micro Machine and Human Science, Nagoya, Japan, pp. 115-120.
Ashley, S., "Artificial Muscles", Scientific American 2003, pp. 53-59.
Ashley, S., "Smart Skis and Other Adaptive Structures," Mechanical Engineering, Nov. 1995, pp. 77-81.
Bar-Cohen, Yoseph, JPL, WorldWide ElectroActive Polymers, EAP (Artifical Muscles) Newsletter, vol. 1, No. 1, Jun. 1999.
Bar-Cohen, Yoseph, JPL, WorldWide ElectroActive Polymers, EAP (Artifical Muscles) Newsletter, vol. 1, No. 2, Dec. 1999.
Bar-Cohen, Yoseph, JPL, WorldWide ElectroActive Polymers, EAP (Artifical Muscles) Newsletter, vol. 2, No. 1, Jul. 2000.
Bar-Cohen, Yoseph, JPL, WorldWide ElectroActive Polymers, EAP (Artifical Muscles) Newsletter, vol. 2, No. 2, Dec. 2000.
Bar-Cohen, Yoseph, JPL, WorldWide ElectroActive Polymers, EAP (Artifical Muscles) Newsletter, vol. 3, No. 1, Jun. 2001.
Bar-Cohen, Yoseph, JPL, WorldWide ElectroActive Polymer Actuators Webhub webpages 1-7, http://ndeaa.jpl.nasa.gov/nasa-nde/lommas/eap/EAP-web.htm, downloaded Jul. 23, 2001 (7 pages).
Baughman, R., L. Shacklette, R. Elsenbaumer, E. Plichta, and C. Becht "Conducting Polymer Electromechanical Actuators," Conjugated Polymeric Materials: Opportunities in Electronics, Optoelectronics and Molecular Electronics, eds. J.L. Bredas and R.R. Chance, Kluwer Academic Publishers, The Netherlands, pp. 559-582, 1990.
Baughman, R.H., L.W. Shacklette, R.L. Elsenbaumer, E.J. Plichta, and C. Becht "Micro electromechanical actuators based on conducting polymers," in Molecular Electronics, Materials and Methods, P.I. Lazarev (ed.), Kluwer Academic Publishers, pp. 267-289 (1991).

Beckett, J., "New Robotics Tap the Mind, Help the Heart, SRI shows of latest technologies," San Francisco Chronicle, Aug. 27, 1998.
Begley, M. et al., "The Electro-Mechanical Response to Highly Compliant Substrates and Thin Stiff Films with Periodic Cracks," International Journal of Solids and Structures, 42:5259-5273, 2005.
Benslimane, M and P. Gravesen, "Mechanical Properties of Dielectric Elastomer Actuators with Smart Metallic Compliant Electrodes," Proceedings of SPIE, International Society for Optical Engineering, vol. 4695, Jan. 1, 2002, pp. 150-157.
Bharti, V., Y. Ye, T.-B. Xu and Q.M. Zhang, "Correlation Between Large Electrostrictive Strain and Relaxor Behavior with Structural Changes Induced in P(VDF-TrFE) Copolymer by Electron Irradiation," Mat. Res. Soc. Symp. Proc. vol. 541, pp. 653-659 (1999).
Bharti, V., Z.-Y.Cheng S. Gross, T.-B. Xu and Q.M. Zhang, "High Electrostrictive Strain Under High Mechanical Stress in Electron-Irradiated Poly(vinylidene fluoride-trifluoroethylene) Copolymer," Applied Physics Letters, vol. 75, No. 17, pp. 2653-2655 (Oct. 25, 1999).
Bharti, V., H.S. Xu, G. Shanthi and Q.M. Zhang, "Polarization and Structural Properties of High Energy Electron Irradiated Poly(vinylidene fluoride-trifluoroethylene) Copolymer Films," to be published in J. Appl. Phys. (2000).
Bharti, V.,X.-Z. Zhao, Q.M. Zhang, T. Romotowski, F. Tito, and R. Ting, "Ultrahigh Field Induced Strain and Polarization Response in Electron Irradiated Poly(Vinylidene Fluoride-Trifluoroethylene) Copolymer," Mat. Res. Innovat. vol. 2, pp. 57-63 (1998).
Biomimetic Products, Inc., hhtp://www.biomimetic.com, Jun. 6, 2001.
Bobbio, S., M. Kellam, B. Dudley, S. Goodwin Johansson, S. Jones, J. Jacobson, F. Tranjan, and T. DuBois, "Integrated Force Arrays," in Proc. IEEE Micro Electro Mechanical Systems Workshop, Fort Lauderdale, Florida, Feb. 7-10, 1993, pp. 146-154.
Bohon, K. and S. Krause, "An Electrorheological Fluid and Siloxane Gel Based Electromechanical Actuator: Working Toward an Artificial Muscle," to be published in J. Polymer Sci., Part B. Polymer Phys. (2000).
Boyle, W. et al., "Departure from Paschen's Law of Breakdown in Gases," The Physical Review, Second Series, 97(2): 255-259, Jan. 15, 1955.
Brock, D.L., "Review of Artifical Muscle based on Contractile Polymers," MIT Artificial Intelligence Laboratory, A.I. Memo No. 1330, Nov. 1991.
Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).
Calvert, P. and Z. Liu, "Electrically Stimulated Bilayer Hydrogels as Muscles," Proceedings of the SPIE International Symposium on Smart Structures and Materials: Electro-Active Plymer Actuators and Devices, Mar. 1-2, 1999, Newport Beach, California, USA, pp. 236-241.
Campolo, D., et al., "Efficient Charge Recovery Method for Driving Piezoelectric Actuators with Quasi-Square Waves," IEEE Transaction on Ultrasonics, Ferroelectrics and Frequency Control, IEE, US, vol. 50, No. 3, Mar. 1, 2003, pp. 237-244.
Chen et al., "Active control of low-frequency sound radiation from vibrating panel using planar sound sources," Journal of Vibration and Acoustics, vol. 124, pp. 2-9, Jan. 2002.
Chen, Zheng et al., "Quasi-Static Positioning of Ionic Polymer-Metal Composite (IPMC) Actuators," Proceedings of the 2005 IEEE/ASME International Conference on Advanced Intelligent Mechatronics, Monterey, California, Jul. 24-28, 2005, pp. 60-65.
Cheng, Z.-Y., H.S. Xu, J. Su, Q. M. Zhjang, P.-C. Wang and A.G. MacDiarmid, "High Performance of All-Polymer Electrostrictive Systems," Proceedings of the SPIE Ineternational Symposium on Smart Structures and Materials: Electro-Active Polymer Actuators and Devices, Mar. 1-2, 1999, Newport Beach, California, USA, pp. 140-148.
Cheng, Z.-Y., T.-B. Xu, V. Bharti, S. Wang, and Q.M. Zhang, "Transverse Strain Responses in the Electrostrictive Poly(Vinylidene Fluoride-Trifluorethylene) Copolymer," Appl. Phs. Lett. vol. 74, No. 13, pp. 1901-1903, Mar. 29, 1999.

(56) References Cited

OTHER PUBLICATIONS

Chiarelli, P., A. Della Santa, D. DeRossi, and A. Mazzoldi, "Actuation Properties of Electrochemically Driven Polypyrrole Free-Standing Films," Journal of Intelligent Material Systems and Structures, vol. 6, pp. 32-37, Jan. 1995.

Delille, R. et al., "Novel Compliant Electrodes Based on Platinum Salt Reduction," Smart Structures and Materials 2006: Electroactive Polymer Actuators and Devices (EAPAD), edited by Yoseph Bar-Cohen, Proceedings of SPIE, 6168 (6168Q), 2006.

De Rossi, D., and P. Chiarelli, "Biomimetic Macromolecular Actuators," Macro-Ion Characterization, American Chemical Society Symposium Series, vol. 548, Ch. 40, pp. 517-530 (1994).

Dowling, K., Beyond Faraday—NonTraditional Actuation, available on the World Wide Web at http://www.frc.ri.cmu.edu/~nivek/OTH/beyond-faraday/beyondfaraday.html, 9 pages, 1994.

Egawa, S. and T. Higuchi, "Multi-Layered Electrostatic Film Actuator," Proc. IEEE Micro Electra Mechanical Systems, Napa Valley, California, pp. 166-171 (Feb. 11-14, 1990).

Elhami, K. B. Gauthier-Manuel, "Electrostriction of the Copolymer of Vinylidene-Fluoride and Trifluoroethylene," J. Appl. Phys. vol. 77 (8), 3987-3990, Apr. 15, 1995.

Flynn, Anita M., L.S. Tavrow, S.F. Bart, R.A. Brooks, D.J. Ehrlich, Kr.R. Udayakumar, and L.E. Cross. 1992. "Piezoelectric Micromotors for Microrobots," IEEE Journal of Microelectromechanical Systems, vol. 1, No. 1, pp. 44-51 (Mar. 1992); also published as MIT AI Laboratory Memo 1269, Massachusetts Institute of Technology (Feb. 1991).

Ford, V. and J. Kievet, "Technical Support Package on Traveling-Wave Rotary Actuators", NASA Tech Brief, vol. 21, No. 10, Item #145, from JPL New Technology Report NPO-19261, Oct. 1997.

Full, R.J. and K. Meijer, "Artificial Muscles Versus Natural Actuators from Frogs to Flies," Proceedings of the 7th SPIE Symposium on Smart Structures and Materials—Electroactive Polymers and Devices (EAPAD) Conference, Mar. 6-8, 2000, Newport Beach, California, USA, pp. 2-9.

Furuhata, T., T. Hirano, and H. Fujita, "Array-Driven Ultrasonic Microactuators," Solid State Sensors and Actuators, 1991, Digest of Tech. Papers, Transducers, pp. 1056-1059.

Furukawa, T. and N. Seo, "Electrostriction as the Origin of Piezoelectricity in Ferroelectric Polymers," Japanese J. Applied Physics, vol. 29, No. 4, pp. 675-680 (Apr. 1990).

Gardner, J.W., "Microsensors: Principles and Applications," John Wiley, 1994.

Ghaffarian, S.R., et al., "Electrode Structures in High Strain Actuator Technology," Journal of Optoelectronics and Advanced Materials, Nov. 2007, 9(11), pp. 3585-3591.

Gilbertson, R.G. and J.D. Busch. "Survey of MicroActuator Technologies for Future Spacecraft Missions," presented a the conference entitled "Practical Robotic Interstellar Flight: Are We Ready?" New York University and The United Nations, New York. (Aug. 29 and Sep. 1, 1994); also published on the World Wide Web at http://nonothinc.com/nanosci/microtech/mems/ten-actuators/gilbertson.html.

Goldberg, Lee, "Adaptive-Filtering Developments Extend Noise-Cancellation Applications," Electronic Design, Feb. 6, 1995, pp. 34 and 36.

Greene, M. J.A. Willett, and R. Kornbluh, "Robotic Systems," in ONR Report 32198-2, Ocean Engineering and Marine Systems 1997 Program (Dec. 1997).

Greenland, P. Allegro Microsystems Inc., and B. Carsten, Bruce Carsten Associates, "Stacked Flyback Converters Allow Lower Voltage MOSFETs for High AC Line Voltage Operation," Feature PCIM Article, PCIM, Mar. 2000.

Hansen, G., "High Aspect Ratio Sub-Micron and Nano-Scale Metal Filaments," SAMPE Journal, 41(2): 24-33, 2005.

Heydt, R., R. Pelrine, J. Joseph, J. Eckerle, and R. Kornbluh, "Acoustical Performance of an Electrostrictive Polymer Film Loudspeaker," Journal of the Acoustical Society of America, vol. 107(2), pp. 833-839 (Feb. 2000).

Heydt, R., R. Kornbluh, R. Pelrine, and B. Mason, "Design and Performance of an Electrostrictive Polymer Film Acoustic Actuator," Journal of Sound and Vibration (1998) 215(2), 297-311.

Hirano, M., K. Yanagisawa, H. Kuwano, and S. Nakano, "Microvalve with Ultra-Low Leakage," Tenth Annual International Workshop on Micro Electromechanical Systems, Nagoya, Japan, IEEE Proceedings (Jan. 26-30, 1997), pp. 323-326.

Hirose, S., Biologically Inspired Robots: Snake-like Locomotors and Manipulators, "Development of the ACM as a Manipulator," Oxford University Press, New York, 1993, pp. 170-172.

http://www.neurosupplies.com/pdf_files/transducers.pdf, printed from web Jul. 25, 2001.

Huang, Cheng et al., "Colossal Dielectric and Electromechanical Responses in Self-Assembled Polymeric Nanocomposites", Applied Physics Letters 87, 182901 (2005), pp. 182901-1 through 182901-3.

Hunter, I.W. and S. Lafontaine, "A Comparison of Muscle with Artificial Actuators," Technical Digest of the IEEE Solid-State Sensor and Actuator Workshop, Hilton Head, South Carolina, Jun. 22-25, 1992, pp. 178-185.

Hunter, I., S. Lafontaine, J. Hollerbach, and P. Hunter, "Fast Reversible NiTi Fibers for Use in MicroRobotics," Proc. 1991 IEEE Micro Electro Mechanical Systems—MEMS '91, Nara, Japan, pp. 166-170.

Jacobsen, S., R. Price, J. Wood, T. Rytting and M. Rafaelof, "A Design Overview of an Eccentric-Motion Electrostatic Microactuator (the Wobble Motor)", Sensors and Actuators, 20 (1989) pp. 1-16.

Joseph, J., R. Pelrine, J. Eckerle, J. Bashkin, and P. Mulgaonkar, "Micro Electrochemical Composite Sensor", SRI International, printed from web Jul. 25, 2001.

Kaneto, K., M. Kaneko, Y. Min, and A.G. MacDiarmid, "Artifical Muscle: Electromechanical Actuators Using Polyaniline Films," Synthetic Metals 71, pp. 2211-2212, 1995.

Kawamura, S., K. Minani, and M. Esashi, "Fundamental Research of Distributed Electrostatic Micro Actuator," Technical Digest of the 11th Sensor Symposium, pp. 27-30 (1992).

Khuri-Yakub et al., "Silicon micromachined ultrasonic transducers," Japan Journal of Applied Physics, vol. 39 (2000), pp. 2883-2887, Par 1, No. 5B, May 2000.

Kinsler et al., Fundamentals of Acoustics, Third Edition, John Wiley and Sons, 1982.

Kondoh, Y., and T. Ono. 1991. "Bimorph Type Actuators using Lead Zinc Niobate-based Ceramics," Japanese Journal of Applied Physics, vol. 30, No. 9B, pp. 2260-2263, Sep. 1991.

Kornbluh, R., R. Pelrine, R. Heydt, and Q. Pei, "Acoustic Actuators Based on the Field-Activated Deformation of Dielectric Elastomers," (2000).

Kornbluh, R., G. Andeen, and J. Eckerle, "Artificial Muscle: The Next Generation of Robotic Actuators," presented at the Fourth World Conference on Robotics Research, SME Paper M591-331, Pittsburgh, PA, Sep. 17-19, 1991.

Kornbluh, R., "Description of Children's Tour," Aug. 20, 2000.

Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for Office of Naval Research, Nov. 1996.

Kornbluh, R., R. Pelrine, J. Joseph, "Elastomeric Dielectric Artificial Muscle Actuators for Small Robots," Proceedings of the Third IASTED International Conference on Robotics and Manufacturing, Jun. 14-16, 1995, Cancun, Mexico.

Kornbluh, R., R. Pelrine, Q. Pei, and V. Shastri "Electroactive Polymer (EAP) Actuators as Artificial Muscles—Reality, Potential and Challenges", Chapter 16, Application of Dielectric EAP Actuators, SPIE Press, May 2001.

Kornbluh, R. et al., "Electroactive polymers: An emerging technology for MEMS," (invited) in MEMS/MOEMS Components and Their Applications, eds. S. Janson, W. Siegfried, and A. Henning, Proc. SPIE, 5344:13-27, 2004.

Kornbluh, R. et al., "Electroelastomers: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.

(56) References Cited

OTHER PUBLICATIONS

Kornbluh, R., Pelrine, R., Eckerie, J., Joseph, J., "Electrostrictive Polymer Artificial Muscle Actuators," IEEE International Conference on Robotic and Automation, Leuven, Belgium, 1998.

Kornbluh, R., R. Pelrine, Jose Joseph, Richard Heydt, Qibing Pei, Seiki Chiba, 1999. "High-Field Electrostriction of Elastomeric Polymer Dielectrics for Actuation", Proceedings of the SPIE International Symposium on Smart Structures and Materials: Electro-Active Polymer Actuators and Devices, Mar. 1-2, 1999, Newport Beach, California, USA. pp. 149-161.

Kornbluh et al., "Medical Applications of New Electroactive Polymer Artificial Muscles," SRI International, Menlo Park, CA, JSPP, v. 16, 2004.

Kornbluh, Roy D., Robotic Systems, Ocean Engineering and Marine Systems, 2000 Program, Jan. 2001, Office of Naval Research Public Release, ONR-32100-1.

Kornbluh, Roy D., Robotic Systems, Ocean Engineering and Marine Systems, 1999 Program, Feb. 2000, Office of Naval Research Public Release, ONR-32100-2.

Kornbluh, Roy D., Robotic Systems, Ocean Engineering and Marine Systems, 1997 Program, Dec. 1997, Office of Naval Research Public Release, ONR-32198-2.

Kornbluh, Roy D., Robotic Systems, Ocean Engineering and Marine Systems, 1998 Program, Feb. 1999, Office of Naval Research Public Release, ONR-32199-4.

Kornbluh, R., "Presentation to Colin Corporation", Jan. 1997.

Kornbluh, R. Presentation to Medtronic, "Elastomeric Polymer Actuator and Transducers: The Principles, Performance and Applications of a New High-Strain Smart Material Technology", SRI International Medtronic Forum, Brooklyn Center, Minnesota, Jan. 2000.Jan. 2000.

Kornbluh, R. et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Kornbluh, R., Pelrine, R. Joseph, J., Pei, Q. and Chiba., "Ultra-High Strain Response of Elastomeric Polymer Dielectrics", Proc. Materials Res. Soc., Fall meeting, Boston, MA, pp. 1-12, Dec. 1999.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials—Electroactive Polymers and Devices (EAPAD) Conference, Mar. 6-8, 2000, Newport Beach, California, USA, pp. 51-64.

Kornbluh, R., "Use of Artificial Muscle Butterfly for Chronicle Newpaper Photograph," Aug. 1998.

Ktech's PVDF Sensors, http://www.ktech.com/pvdf.htm, Jun. 6, 2001, pp. 1-5.

Kymissis et al., "Parasitic Power Harvesting in Shoes," XP-010312825—Abstract, Physics and Media Group, MIT Media Laboratory E15-410, Cambridge, MA, Oct. 19, 1998, pp. 132-139.

Lacour, S. et al., "Mechanisms of Reversible Stretchability of Thin Metal Films on Elastomeric Substrates," Applied Physics Letters 88, 204103, 2006.

Lacour, S. et al., "Stretchable Interconnects for Elastic Electronic Surfaces," Proceedings of the IEEE on Flexible Electronics Technology, 93(8): 1459-1467, 2005.

Lakes, R.S., "Extreme damping in compliant composites with a negative stiffness phase" or "Extreme Damping in Composite Materials with Negative Stiffness Inclusions", Nature, 410, 565-567, Mar. 2001.

Lakes, R.S., "Extreme damping in compliant composites with a negative stiffness phase", Philosophical Magazine Letters, 81, 95-100 (2001).

Lakes, R.S., "Extreme damping in compliant composites with a negative stiffness phase" or "Extreme Damping in Composite Materials with a Negative Stiffness Phase", Physical Review Letters, 86, 2897-2900, Mar. 26, 2001.

Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).

Lawless, W. and R. Arenz, "Miniature Solid-state Gas Compressor," Rev. Sci Instrum., 58(8), pp. 1487-1493, Aug. 1987.

Liu, C., Y. Bar-Cohen, and S. Leary, "Electro-statically stricted polymers (ESSP)," Proceedings of the SPIE International Symposium on Smart Structures and Materials: Electro-Active Polymer Actuators and Devices, Mar. 1-2, 1999, Newport Beach, California, USA., pp. 186-190.

Liu, C. & Y. Bar-Cohen, "Scaling Laws of Microactuators and Potential Aplications of Elecroactive Polymers in MEMS", SPIE, Conference on Electroactive Polymer Actuators and Devices, Newport Beach, CA Mar. 1999.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

Madden et al., "Conducting polymer actuators as engineering materials," SPIE: Smart Materials and Structures, ed. Yoseph Bar-Cohen, Bellingham, WA, pp. 176-190, Pub 2002.

Madden, J.D. et al., "Fast contracting polypyrrole actuators", Jan. 6, 2000, Elsevier Science S.A., pp. 185-192.

Martin, J. and R. Anderson, 1999. "Electrostriction in Field-Structured Composites: Basis for a Fast Artificial Muscle?", The Journal of Chemical Physics, vol. 111, No. 9, pp. 4273-4280, Sep. 1, 1999.

Measurements Specialties, Inc.—Piezo Home, http://www.msiusa.com/piezo/index.htm, Jun. 6, 2001.

Möller, S. et al., A Polymer/semiconductor write-once read-many-times memory, Nature, vol. 26, Nov. 13, 2003, pp. 166-169, Nature Publishing Group.

Nguyen, T.B., C.K. DeBolt, S.V. Shastri and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Nguyen, T., Green, M., and Kornbluh, R., "Robotic Systems," in ONR Ocean, Atmosphere, and Space Fiscal Year 2000 Annual Reports (Jan. 2001). (Cited in U.S. Pat. No. 7,211,937).

Nihon Kohden Corporation, Operators Manual, available Oct. 1, 2001.

NXT plc, Huntingdon, UK (www.nxtsound.com) Sep. 17, 2008.

Ohara, K., M. Hennecke, and J. Fuhrmann, "Electrostriction of polymethylmethacrylates," Colloid & Polymer Sci. vol. 280, 164-168 (1982).

Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.

Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).

Osterbacka, R. et al., "Two-Dimensional Electronic Excitations in Self-Assembled Conjugated Polymer Nanocrystals," Science, vol. 287:839-842, Feb. 4, 2000.

Otero, T.F., J. Rodriguez, E. Angulo and C. Santamaria, "Artificial Muscles from Bilayer Structures," Synthetic Metals, vol. 55-57, pp. 3713-3717 (1993).

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.

Park, S.E., and T. Shrout., "Ultrahigh Strain and Piezoelectric Behavior in Relaxor Based Ferroelectric Single Crystals," J. Appl. Phys., vol. 82, No. 4, pp. 1804-1811, Aug. 15, 1997.

(56) References Cited

OTHER PUBLICATIONS

Pei, Q., O. Inganäs, and I. Lundström, "Bending Bilayer Strips Built From Polyaniline for Artificial Electrochemical Muscles," Smart Materials and Structures, vol. 2, pp. 1-6., Jan. 22, 1993.
Pei, Qibing "Description of Conference Demonstration" Mar. 2001.
Pei et al., "Electrochemical Applications of the Bending Beam Method. 1. Mass Transport and Volume Changes in Polypyrrole During Redox," J. Phys. Chem., 1992, 96, pp. 10507-10514.
Pei, Q. et al., "Multifunctional Electroelastomer Roll Actuators and Their Application for Biomimetic Walking Robots," Smart Structures and Materials 2003. Electroactive Polymer Actuators and Devices, San Diego, CA, USA, Mar. 2003, vol. 5051, 2003, pp. 281-290, XP002291729, Proceedings of the SPIE, ISSN: 0277-786X, the whole document.
Pei, Q. et al., "Multifunctional Electroelastomer Rolls," Mat. Res. Soc. Symp. Proc., vol. 698, Nov. 26-30, 2001, Boston, MA, pp. 165-170.
Pei, Q., Pelrine, R., Kornbluh, R., Jonasdottir, S., Shastri, V., Full, R., "Multifunctional Electroelastomers: Electroactive Polymers Combining Structural, Actuating, and Sensing Functions," ITAD-433-PA-00-123, University of California at Berkeley, Berkeley, CA, available at www.sri.com-publications, Jan. 17, 2001.
Pei, Q. et al., "Recent Progress on Electroelastomer Artificial Muscles and Their Application for Biomimetic Robots", SPIE, Pub. Jun. 2004, 11 pages.
Pelrine, R. et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.
Pelrine, R. and Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.
Pelrine, R., Kornbluh, and J. Joseph, "Electrostriction of Polymer Dielectrics with Compliant Electrodes as a Means of Actuation," Sensors and Actuators A: Physical, vol. 64, No. 1, 1998, pp. 77-85.
Pelrine, R., R. Kornbluh, J. Joseph and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.
Pelrine et al., "Electrostrictive Polymer Artificial Muscle Actuators," May 1998, Proc. of the 1998 IEEE Conf. on Robotics & Automation, pp. 2147-2154.
Pelrine, R., R. Kornbluh, and J. Joseph, FY 1992 Final Report on Artifical Muscle for Small Robots, ITAD-3393-FR-93-063, SRI International, Menlo Park, California, Mar. 1993.
Pelrine, R., R. Kornbluh, and J. Joseph, FY 1993 Final Report on Artifical Muscle for Small Robots, ITAD-4570-FR-94-076, SRI International, Menlo Park, California, 1994.
Pelrine, R., R. Kornbluh, and J. Joseph, FY 1994 Final Report on Artifical Muscle for Small Robots, ITAD-5782-FR-95-050, SRI International, Menlo Park, California, 1995.
Pelrine, R., R. Kornbluh, and J. Joseph, FY 1995 Final Report on Artifical Muscle for Small Robots, ITAD-7071-FR-96-047, SRI International, Menlo Park, California, 1996.
Pelrine, R., R. Kornbluh, and J. Joseph, FY 1996 Final Report on Artifical Muscle for Small Robots, ITAD-7228-FR-97-058, SRI International, Menlo Park, California, 1997.
Pelrine, R., R. Kornbluh, and J. Joseph, FY 1997 Final Report on Artifical Muscle for Small Robots, ITAD-1612-FR-98-041, SRI International, Menlo Park, California, 1998.
Pelrine, R., R. Kornbluh, and J. Joseph, FY 1998 Final Report on Artifical Muscle for Small Robots, ITAD-3482-FR-99-36, SRI International, Menlo Park, California, 1999.
Pelrine, R., R. Kornbluh, and J. Joseph, FY 1999 Final Report on Artifical Muscle for Small Robots, ITAD-10162-FR-00-27, SRI International, Menlo Park, California, 2000.
Pelrine, R., R. Kornbluh, Q. Pei, and J. Joseph, "High Speed Electrically Actuated Elastomers with Over 100% Strain," Science, vol. 287, No. 5454, pp. 1-21, 2000.
Pelrine, R., R. Kornbluh, Q. Pei, and J. Joseph. "High Speed Electrically Actuated Elastomers with Strain Greater Than 100%", Science, Reprint Series, Feb. 4, 2000, vol. 287, pp. 836-839.
Pelrine, R., R. Kornbluh, and G. Kofod, "High Strain Actuator Materials Based on Dielectric Elastomers," submitted to Advanced Materials (May 2000).
Pelrine, R., Roy Kornbluh, Jose Joseph, Qibing Pei, Seiki Chiba "Recent Progress in Artificial Muscle Micro Actuators," SRI Interational, Tokyo, 1999 MITI/NEEDOIMNIC, 1999.
Pelrine, R., R. Kornbluh, J. Joseph and S. Chiba, "Review of Artificial Muscle Approaches," invited paper, in Proc. Third International Symposium on Micro Machine and Human Science, Nagoya, Japan, Oct. 14-16, 1992.
Piezoflex(TM) PVDF Polymer Sensors, http://www.airmar.com/piezo/pvdf.htm. Jun. 6, 2001.
PowerLab ADInstruments, MLT001 High-Sensitivity Force Transducers, AD Instruments Transducers Series, printed from web Jul. 25, 2001.
Prahlad, H. et al., "Programmable Surface Deformation: Thickness-Mode Electroactive Polymer Actuators and their Applications," Proc. SPIE, vol. 5759, 102, 2005, 12 pages.
Puers et al, "A Capacitive Pressure Sensor with Low Impedance Output and Active Suppression of Parasitic Effects," Sensors and Actuators, A21-A23 (1990) 108-114.
Puers, Robert, "Capacitive sensors: when and how to use them," Sensors and Actuators A, 37-38 (1993) 93-105.
Reed, C. et al., "The Fundamentals of Aging HV Polymer-Film Capacitors," IEEE Transactions on Dielectrics and Electrical Insulation, 1(5): 904-922, 1994.
Sakarya, S., "Micromachining Techniques for Fabrication of Integrated Light Modulting Devices", Netherlands 2003, pp. 1-133.
Scheinbeim, J., B. Newman, Z. Ma, and J. Lee, "Electrostrictive Response of Elastomeric Polymers," ACS Polymer Preprints, 33(2), pp. 385-386, 1992.
Schlaberg, H. I., and J. S. Duffy, "Piezoelectric Polymer Composite Arrays for Ultrasonic Medical Imaging Applications," Sensors and Actuators, A 44, pp. 111-117, Feb. 22, 1994.
Seoul et al., "Electrospinning of Poly(vinylidene fluoride) Dimethylformamide Solutions with Carbon Nanotubes," Department of Textile Engineering, Inha University, Mar. 31, 2003.
Shahinpoor, M., "Micro-electro-mechanics of Ionic Polymer Gels as Electrically Controllable Artificial Muscles," J. Intelligent Material Systems and Structures, vol. 6, pp. 307-314, May 1995.
Shkel, Y. and D. Klingenberg, "Material Parameters for Electrostriction," J. Applied Physics, vol. 80(8), pp. 4566-4572, Oct. 15, 1996.
Smela, E., O. Inganas, and I. Lundstrom, "Controlled Folding of Micrometer-size Structures," Science, vol. 268, pp. 1735-1738 (Jun. 23, 1995).
Smela, E., O. Inganas, Q. Pei and I. Lundstrom, "Electrochemical Muscles: Micromachinging Fingers and Corkscrews," Advanced Materials, vol. 5, No. 9, pp. 630-632, Sep. 1993.
Smith, S. et al., A low switching voltage organic-on-inorganic heterojunction memory element utilizing a conductive polymer fuse on a doped silicon substrate, Applied Physics Letters, vol. 84, No. 24, May 28, 2004, pp. 5019-5021.
Sokolova, M. et al., "Influence of a Bias Voltage on the Characteristics of Surface Discharges in Dry Air," Plasma Processes and Polymers, 2: 162-169, 2005.
Sommer-Larsen, P. and A. Ladegaard Larsen, "Materials for Dielectric Elastomer Actuators," SPIE, vol. 5385, Mar. 1, 2004, pp. 68-77.
Standard Test Methods for Rubber Deterioration—Cracking in an Ozone Controlled Environment, ASTM International, D 1149-07.
Su, J., Q.M. Zhang, C.H. Kim, R.Y. Ting and R. Capps, "Effects of Transitional Phenomena on the Electric Field induced Strain-electrostrictive Response of a Segmented Polyurethane elastomer," pp. 1363-1370, Jan. 20, 1997.
Su, J, Z. Ounaies, J.S. Harrison, Y. Bara-Cohen and S. Leary, "Electromechanically Active Polymer Blends for Actuation," Proceedings of 7th SPIE Symposium on Smart Structures and Materials—Electroactive Polymers and Devices (EAPAD) Conference, Mar. 6-8, 2000, Newport Beach, CA, USA, pp. 65-72.

(56) References Cited

OTHER PUBLICATIONS

Suzuki et al., "Sound radiation from convex and concave domes in infinite baffle," Journal of the Acoustical Society of America, vol. 69(2), Jan. 1981.
Technology, http://www.micromuscle.com/html/technology.html, Jun. 6, 2001.
"The Rubbery Ruler", http://www.ph.unimelb.edu.au, printed from web Jul. 25, 2001.
Tobushi, H., S. Hayashi, and S. Kojima, "Mechanical Properties of Shape Memory Polymer of Polyurethane Series," in JSME International Journal, Series I, vol. 35, No. 3, 1992.
Todorov et al, "WWWeb Application for Ferropiezoelectric Ceramic Parameters Calculation", Proceedings 24th International Conference on Microelectronics, vol. 1, May 2004, pp. 507-510.
Treloar, L.R.G., "Mechanics of Rubber Elasticity," J Polymer Science, Polymer Symposium, No. 48, pp. 107-123, 1974.
Uchino, K. 1986. "Electrostrictive Actuators: Materials and Applicaions," Ceramic Bulletin, 65(4), pp. 647-652, 1986.
Unger et al. (2000), "Monolithic Microfabricated Valves and Pumps by Multilayer Soft Lithography," Science 288:113-116, no month.
Wade, Jr., W.L., R.J. Mannone and M. Binder, "Increased Dielectric Breakdown Strengths of Melt-Extruded Polyporphlene Films," Polymer vol. 34, No. 5, pp. 1093-1094 (1993).
Wax, S.G. and R.R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, CA, USA, pp. 2-10.
Whitesides et al. (2001), "Flexible Methods for Microfluidics," Physics Today 52(6):42-47, no month.
Winters, J., "Muscle as an Actuator for Intelligent Robots," Robotics Research: Trans. Robotics International of SME, Scottsdale, AZ (Aug. 18-21, 1986).
Woodard, Improvements of ModalMax High-Fidelity Peizoelectric Audio Device (LAR-16321-1), NASA Tech Briefs, May 2005, p. 36.
Xia, Younan et al., "Triangular Nanoplates of Silver: Synthesis, Characterization, and Use as Sacrificial Templates for Generating Triangular Nanorings of Gold," Adv. Mater., 2003, 15, No. 9, pp. 695-699.
Yam, P., "Plastics Get Wired," Scientific American, vol. 273, pp. 82-87, Jul. 1995.
Yoshio, O., "Ablation Characteristics of Silicone Insulation," Journal of Polymer Science: Part A: Polymer Chemistry, 36: 233-239, 1998.
Yuan, W. et al. "New Electrode Materials for Dielectric Elastomer Actuators," Proc. SPIE, 6524 (6524ON), 2007.
Zhang, Q.M., V. Bharti, Z.Y. Cheng, T.B. Xu, S. Wang, T.S. Ramotowski, F. Tito, and R. Ting, "Electromechanical Behavior of Electroactive P(VDF-TrFE) Copolymers," Proceedings of the SPIE International Symposium on Smart Structures and Materials: Electro-Active Polymer Actuators and Devices, Mar. 1-2, 1999, Newport Beach, CA, USA, pp. 134-139.
Zhang, Q., V. Bharti and X. Zhao, "Giant Electrostriction and Relaxor Ferroelectric Behavior in Electron-irradiated Poly(vinylidene fluoride-trifluoroethylene) Copolymer," Science, vol. 280, pp. 2101-2104 (Jun. 26, 1998).
Zhang, Q.M., Z.Y. Cheng, V. Bharti, T.B. Xu, H. Xu, T. Mai and S.J. Gross, "Piezoelectric and Electrostrictive Polymeric Actuator Materials," Proceedings of the 7th SPIE Symposium on Smart Structures and Materials: Electroactive Polymers and Devices (EAPAD) Conference, Mar. 6-8, 2000, Newport Beach, CA, USA, pp. 34-50.
Zhenyi, M., J.I. Scheinbeim, J.W. Lee, and B.A. Newman. 1994. "High Field Electrostrictive Response of Polymers," Journal of Polymer Sciences, Part B—Polymer Physics, vol. 32, pp. 2721-2731, 1994.
U.S. Appl. No. 14/440,991, filed May 6, 2015.
U.S. Appl. No. 14/437,741, filed Apr. 22, 2015.
U.S. Appl. No. 14/771,371, filed Aug. 28, 2015.
U.S. Appl. No. 14/649,743, filed Jun. 4, 2015.
Polyoxymethylene urea NPL document, retrieved Nov. 11, 2015.

\* cited by examiner

STRETCH FRAME FOR STRETCHING PROCESS

RELATED APPLICATIONS

This application is the U.S. National Stage application filed under 35 U.S.C. §371(c) of International Application No. PCT/US2013/046248, filed on Jun. 18, 2013, that claims the benefit, under 35 USC §119(e), of U.S. Provisional Application No. 61/660,887 filed Jun. 18, 2012 entitled "STRETCH FRAME CONCEPT FOR RE-ENGINEERED STRETCHING PROCESS" the entireties of which is incorporated herein by reference.

FIELD OF INVENTION

The present invention is directed in general to a stretch frame for a stretching process during manufacturing and more specifically, to a stretch frame for a stretching process during high volume manufacturing processes for producing electroactive polymer cartridges and transducers.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of device may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers", for the fabrication of transducers. These considerations include potential force, power density, power conversion/consumption, size, weight, cost, response time, duty cycle, service requirements, environmental impact, etc. As such, in many applications, electroactive polymer technology offers an ideal replacement for piezoelectric, shape-memory alloy and electromagnetic devices such as motors and solenoids.

An electroactive polymer transducer comprises two electrodes having deformable characteristics and separated by a thin elastomeric dielectric material. When a voltage difference is applied to the electrodes, the oppositely charged electrodes attract each other thereby compressing the polymer dielectric layer therebetween. As the electrodes are pulled closer together, the dielectric polymer film becomes thinner (the Z-axis component contracts) as it expands in the planar directions (along the X- and Y-axes), i.e., the displacement of the film is in-plane. The electroactive polymer film may also be configured to produce movement in a direction orthogonal to the film structure (along the Z-axis), i.e., the displacement of the film is out-of-plane. U.S. Pat. No. 7,567,681 discloses electroactive polymer film constructs which provide such out-of-plane displacement—also referred to as surface deformation or as thickness mode deflection.

The material and physical properties of the electroactive polymer film may be varied and controlled to customize the deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), the tension or pre-strain placed on the electroactive polymer film as a whole, and the amount of voltage applied to or capacitance induced upon the film may be controlled and varied to customize the features of the film when in an active mode.

Numerous applications exist that benefit from the advantages provided by such electroactive polymer films whether using the film alone or using it in an electroactive polymer actuator. One of the many applications involves the use of electroactive polymer transducers as actuators to produce haptic, tactile, vibrational feedback (the communication of information to a user through forces applied to the user's body), and the like, in user interface devices. There are many known user interface devices which employ such feedback, typically in response to a force initiated by the user. Examples of user interface devices that may employ such feedback include keyboards, keypads, game controller, remote control, touch screens, computer mice, trackballs, stylus sticks, joysticks, etc. The user interface surface can comprise any surface that a user manipulates, engages, and/or observes regarding feedback or information from the device. Examples of such interface surfaces include, but are not limited to, a key (e.g., keys on a keyboard), a game pad or buttons, a display screen, etc.

The feedback provided by these types of interface devices is in the form of physical sensations, such as vibrations, pulses, spring forces, etc., which a user senses either directly (e.g., via touching of the screen), indirectly (e.g., via a vibrational effect such as when a cell phone vibrates in a purse or bag) or otherwise sensed (e.g., via an action of a moving body that creates a pressure disturbance sensed by the user). The proliferation of consumer electronic media devices such as smart phones, personal media players, portable computing devices, portable gaming systems, electronic readers, etc., can create a situation where a sub-segment of customers would benefit or desire an improved haptic effect in the electronic media device. However, increasing feedback capabilities in every model of an electronic media device may not be justified due to increased cost or increased profile of the device. Moreover, customers of certain electronic media devices may desire to temporarily improve the haptic capabilities of the electronic media device for certain activities.

Use of electroactive polymer materials in consumer electronic media devices as well as the numerous other commercial and consumer applications highlights the need to increase production volume while maintaining precision and consistency of the films.

Present techniques for stretching and laminating films to produce electroactive polymer devices require many steps and require that the stretch frame is cleaned after each use, which is very labor intensive. The present disclosure provides various stretch frames for producing electroactive polymer devices as described herein in the detailed description of the invention section of the present disclosure. The present disclosure also provides various stretching processing techniques for producing electroactive polymer devices as described herein in the detailed description of the invention section of the present disclosure.

SUMMARY OF THE INVENTION

Electroactive polymer devices that can be used with these designs include, but are not limited to planar, diaphragm, thickness mode, roll, and passive coupled devices (hybrids) as well as any type of electroactive polymer device described in the commonly assigned patents and applications cited herein.

In one embodiment, an apparatus comprising a frame and a pressure sensitive adhesive (PSA) applied to at least a portion of the frame is provided. The pressure sensitive adhesive is arranged to bond a pre-strained film to the frame.

In some variations, a method comprising providing a stretch frame, applying a pressure sensitive adhesive on at least a portion of the stretch frame, providing a film, stretching the film, and laminating the pre-strained film onto the pressure sensitive adhesive coating of the stretch frame is provided.

In other variations, a method of making a stretch frame is provided. The method comprises providing a frame and applying a pressure sensitive adhesive on at least a portion of the frame. In one embodiment, the method further comprises the use of a release layer between the frame and the adhesive.

As noted above, there remains a need to mass produce such electroactive polymer devices while maintaining the performance characteristics obtained through batch production or lower volume manufacturing processes.

The present disclosure provides stretch frames and stretching processes for producing electroactive polymer devices and reducing manufacturing cycle time, waste, and labor for cleaning conventional stretch frames after uses. Other benefits include cost reduction, improvement in lamination integrity, enabling the use of narrower frames, providing efficient use of silicone film, increasing throughput, and the film printing process after the film lamination process is made easier with thinner stretch frames.

These and other features, objects and advantages of the invention will become apparent to those persons skilled in the art upon reading the details of the invention as more fully described below. In addition, variations of the processes and devices described herein include combinations of the embodiments or of aspects of the embodiments where possible are within the scope of this disclosure even if those combinations are not explicitly shown or discussed.

BRIEF DESCRIPTION OF THE DRAWINGS

The invention is best understood from the following detailed description when read in conjunction with the accompanying drawings. To facilitate understanding, the same reference numerals have been used (where practical) to designate similar elements are common to the drawings. Included in the drawings are the following.

Figure 1A:
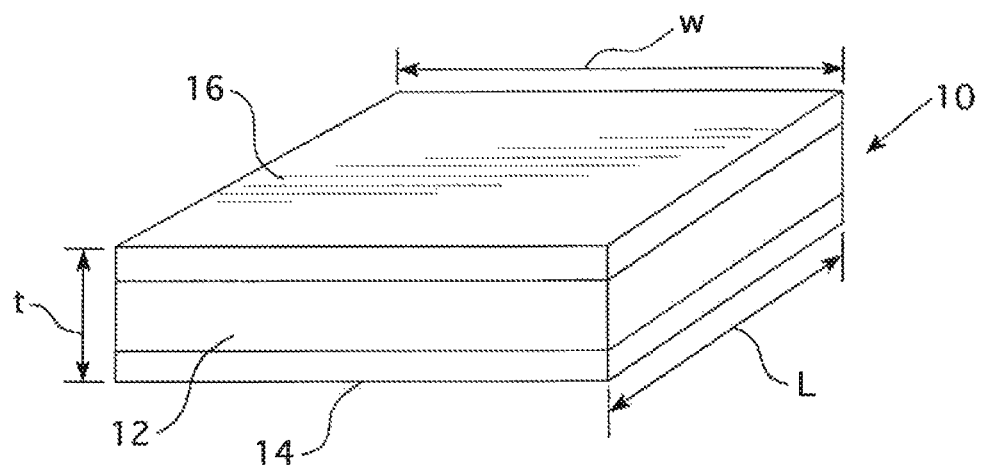
FIGS. 1A and 1B illustrate a top perspective view of a transducer before and after application of a voltage in accordance with one embodiment of the present invention.

Variation of the invention from that shown in the figures is contemplated.

DETAILED DESCRIPTION OF THE INVENTION

Examples of electroactive polymer devices and their applications are described, for example, in U.S. Pat. Nos. 6,343,129; 6,376,971; 6,543,110; 6,545,384; 6,583,533; 6,586,859; 6,628,040; 6,664,718; 6,707,236; 6,768,246; 6,781,284; 6,806,621; 6,809,462; 6,812,624; 6,876,135; 6,882,086; 6,891,317; 6,911,764; 6,940,221; 7,034,432; 7,049,732; 7,052,594; 7,062,055; 7,064,472; 7,166,953; 7,199,501; 7,199,501; 7,211,937; 7,224,106; 7,233,097; 7,259,503; 7,320,457; 7,362,032; 7,368,862; 7,378,783; 7,394,282; 7,436,099; 7,492,076; 7,521,840; 7,521,847; 7,567,681; 7,595,580; 7,608,989; 7,626,319; 7,750,532; 7,761,981; 7,911,761; 7,915,789; 7,952,261; 8,183,739; 8,222,799; 8,248,750; and in U.S. Patent Application Publication Nos.; 2007/0200457; 2007/0230222; 2011/0128239; and 2012/0126959, the entireties of which are incorporated herein by reference.

In various embodiments, the present invention provides a stretch frame for stretching film and/or laminating the stretched film onto the stretch frame. In various embodiments, the present invention provides a stretching process employing the stretch frame for stretching and/or laminating the stretched film. In one embodiment, a polymer film is stretched and/or laminated using the stretch frame and process according to the present disclosure to manufacture electroactive polymer devices. Embodiments of the stretch frame and stretching process according to the present disclosure can be used to stretch and laminate film to reduce manufacturing costs relative to conventional techniques by eliminating numerous processing steps and preclude the need for cleaning the stretch frames after each use, which can be labor intensive. Various embodiments of the present invention employ a unique coating stack to hold a pre-strained film tightly during manufacturing of electroactive polymer devices and to enable easy removal of film remnants left on the stretch frame after the devices are removed, e.g., cut out, from the stretch frame. In one embodiment, the stretch frames are disposable. In another embodiment, at least a portion of the stretch frame can be incorporated permanently into the transducer.

In one embodiment, a pressure sensitive adhesive (PSA) and release coat are applied to the stretch frame to hold a pre-strained film on the stretch frame and to enable easy removal of any pressure sensitive adhesive and/or film remnants from the stretch frame after each use, respectively. In addition to reducing manufacturing costs by decreasing the number of stretching and laminating steps and labor costs of cleaning stretch frames after each use, embodiments of the present invention also enable the use of narrower stretch frames, which provides additional printing area for an equally sized frame with the same outside dimensions, leading to increased manufacturing throughput.

For some electroactive polymer device configurations, the adhesives can be printed after film-to-film lamination. Conventional stretch frames that employ two aluminum stretch frames, it is difficult to build more than two layers of film in a lamination due to the thickness of the stretch frames. Embodiments of the present invention provide thinner single stretch frames to simplify the stretching and/or lamination processes.

Films useful in embodiments of the present invention include, but are not limited to those made from polymers such as silicone, polyurethane, acrylate, hydrocarbon rubber, olefin copolymer, polyvinylidene fluoride copolymer, fluoroelastomer styrenic copolymer, and adhesive elastomer.

Figure 1B:
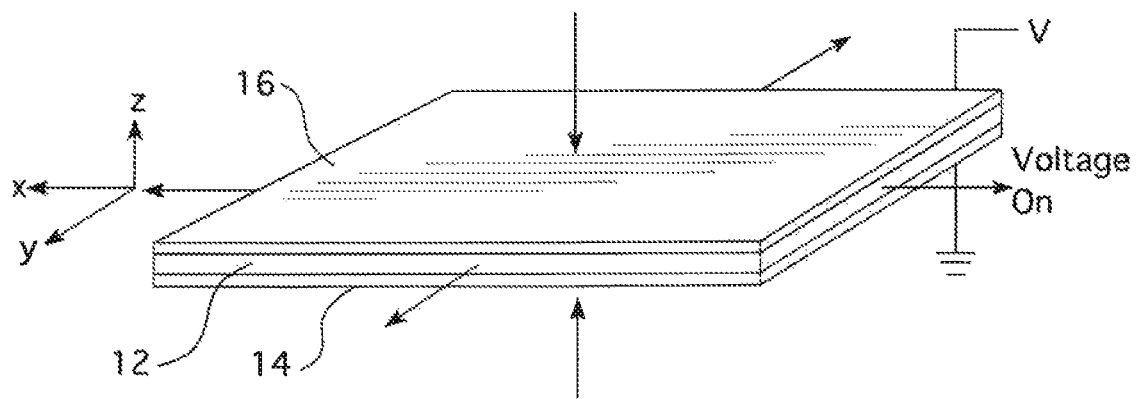

Prior to describing the stretch frame and stretch/laminating process according to various embodiments of the present invention, the description now turns to FIGS. 1A and 1B, which illustrate an example of an electroactive polymer film or membrane 10 structure. A thin elastomeric dielectric film or layer 12 is sandwiched between compliant or stretchable electrode plates or layers 14 and 16, thereby forming a capacitive structure or film. The length "l" and width "w" of the dielectric layer, as well as that of the composite structure, are much greater than its thickness "t". Preferably, the dielectric layer has a thickness in the range from about 10 µm to about 100 µm, with the total thickness of the structure in the range from about 15 µm to about 10 cm. The thickness of the dielectric layer in the transducer can be reduced during fabrication by stretching (or pre-straining) the dielectric film. The stretching can be uniaxial or biaxial. In biaxial pre-strain, the stretch ratio may be equal in all directions or it can be anisotropic with stretching in one axis greater than in another.

It is additionally desirable to select the elastic modulus, thickness, and/or the geometry of electrodes 14, 16 such that the additional stiffness they contribute to the actuator is generally less than the stiffness of the dielectric layer 12, which has a relatively low modulus of elasticity, i.e., less than about 100 MPa and more preferably less than about 10 MPa, but is likely thicker than each of the electrodes. Electrodes suitable for use with these compliant capacitive structures are those capable of withstanding cyclic strains greater than about 1% without failure due to mechanical fatigue.

As seen in FIG. 1B, when a voltage is applied across the electrodes, the unlike charges in the two electrodes 14, 16 are attracted to each other and these electrostatic attractive forces compress the dielectric film 12 (along the Z-axis). The dielectric film 12 is thereby caused to deflect with a change in electric field. As electrodes 14, 16 are compliant, they change shape with dielectric layer 12. In the context of the present disclosure, "deflection" refers to any displacement, expansion, contraction, torsion, linear or area strain, or any other deformation of a portion of dielectric film 12. Depending on the architecture, e.g., a frame, in which capacitive structure 10 is employed (collectively referred to as a "transducer"), this deflection may be used to produce mechanical work. Various different transducer architectures are disclosed and described in the above-identified patent references.

With a voltage applied, the transducer film 10 continues to deflect until mechanical forces balance the electrostatic forces driving the deflection. The mechanical forces include elastic restoring forces of the dielectric layer 12, the compliance or stretching of the electrodes 14, 16 and any external resistance provided by a device and/or load coupled to transducer 10. The resultant deflection of the transducer 10 as a result of the applied voltage may also depend on a number of other factors such as the dielectric constant of the elastomeric material and its size and stiffness. Removal of the voltage difference and the induced charge causes the reverse effects.

In some cases, the electrodes 14 and 16 may cover a limited portion of dielectric film 12 relative to the total area of the film. This may be done to prevent electrical breakdown around the edge of the dielectric or achieve customized deflections in certain portions thereof. Dielectric material outside an active area (the latter being a portion of the dielectric material having sufficient electrostatic force to enable deflection of that portion) may be caused to act as an external spring force on the active area during deflection. More specifically, material outside the active area may resist or enhance active area deflection by its contraction or expansion.

Figure 10:
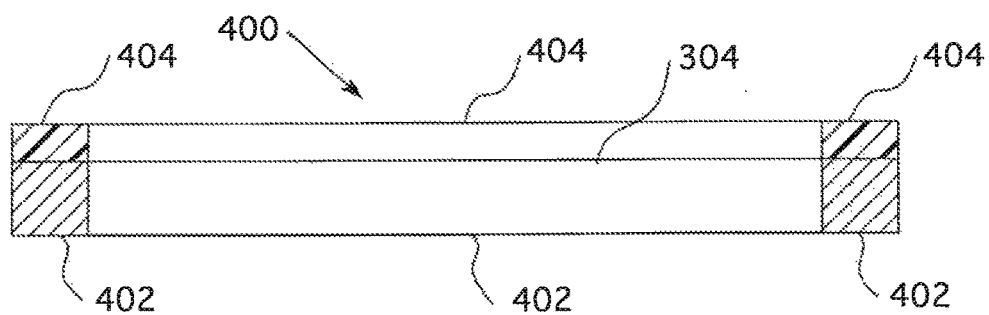
FIG. 10 illustrates a sectional view of the disposable stretch frame shown in FIG. 8 taken along section 10-10.

The dielectric film 12 may be pre-strained using the various embodiments of the stretch frame and process according to the present invention described herein. The pre-strain improves conversion between electrical and mechanical energy. i.e., the pre-strain allows the dielectric film 12 to deflect more and provide greater mechanical work. Pre-strain of a film may be described as the change in dimension in a direction after pre-straining relative to the dimension in that direction before pre-straining. The pre-strain may include elastic deformation of the dielectric film and be formed, for example, by stretching the film in tension and fixing one or more of the edges while stretched, as indicated in FIG. 10. The pre-strain may be imposed at the boundaries of the film or for only a portion of the film and may be implemented by using a rigid frame or by stiffening a portion of the film.

The transducer structure of FIGS. 1A and 1B and other similar compliant structures and the details of their constructs are more fully described in many of the referenced patents and publications disclosed herein.

Figure 2A:
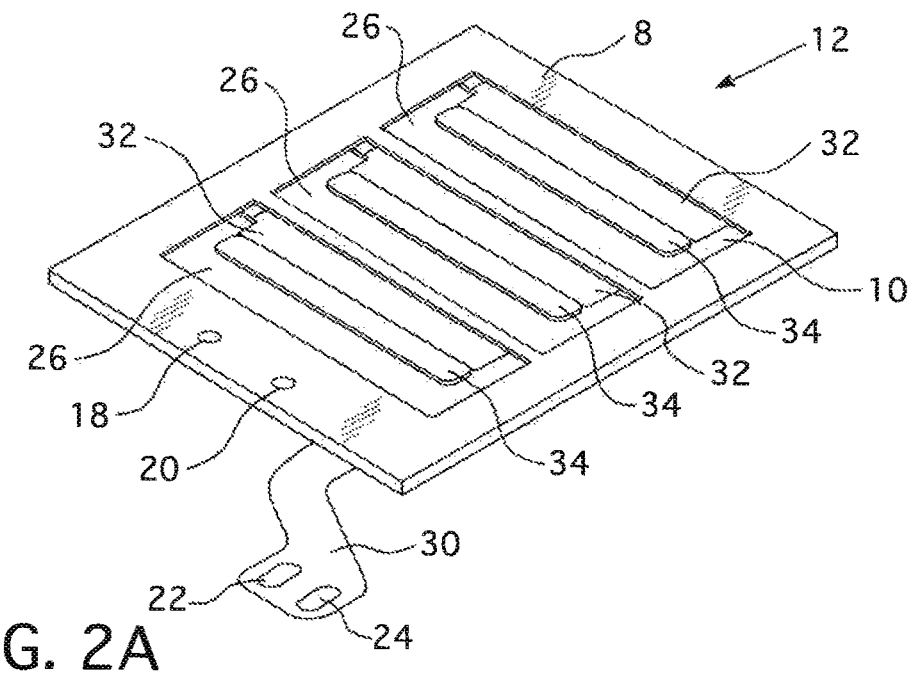
FIG. 2A illustrates an exemplary electroactive polymer cartridge in accordance with one embodiment of the present invention.
Figure 2B:
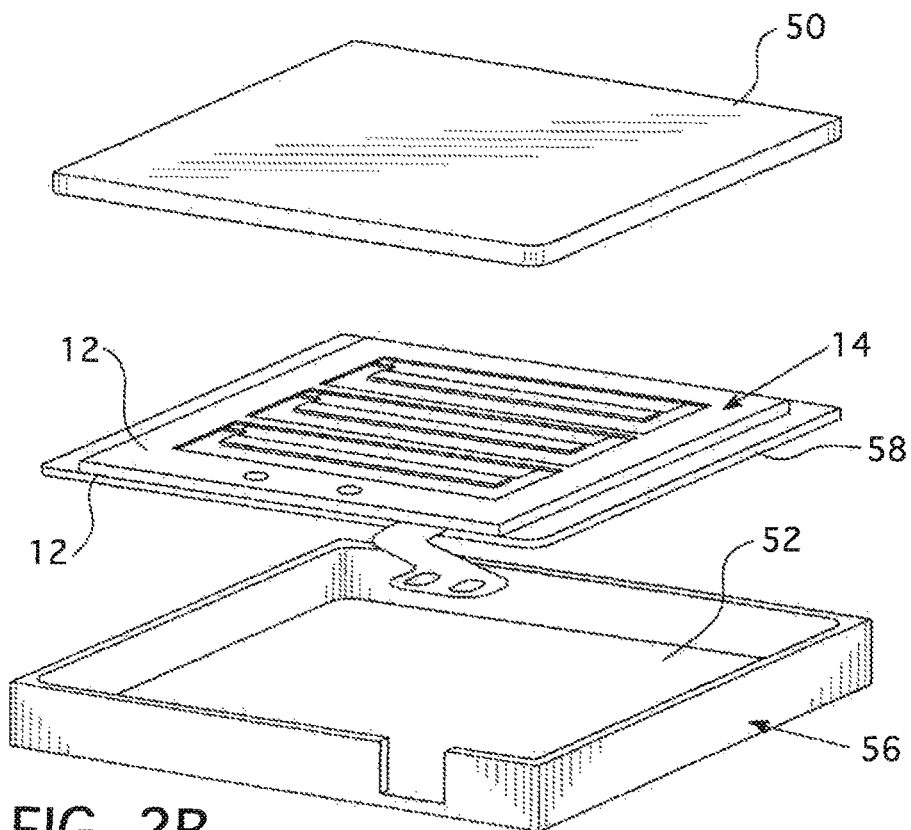
FIG. 2B illustrates an exploded view of an electroactive polymer actuator, inertial mass and actuator housing in accordance with one embodiment of the present invention.

FIG. 2A illustrates an exemplary electroactive polymer cartridge 12 having an electroactive polymer transducer film 26 placed between rigid frame 8 where the electroactive polymer film 26 is exposed in openings of the frame 8. The exposed portion of the film 26 includes two working pairs of thin elastic electrodes 32 on either side of the cartridge 12 where the electrodes 32 sandwich or surround the exposed portion of the film 26. The electroactive polymer film 26 can have any number of configurations. However, in one example, the electroactive polymer film 26 comprises a thin layer of elastomeric dielectric polymer (e.g., made of acrylate, silicone, urethane, thermoplastic elastomer, hydrocarbon rubber, fluoroelastomer, styrenic copolymer elastomer, or the like). When a voltage difference is applied across the oppositely-charged electrodes 32 of each working pair (i.e., across paired electrodes that are on either side of the film 26), the opposed electrodes attract each other thereby compressing the dielectric polymer layer 26 therebetween. The area between opposed electrodes is considered the active area. As the electrodes are pulled closer together, the dielectric polymer 26 becomes thinner (i.e., the Z-axis component contracts) as it expands in the planar directions (i.e., the X- and Y-axes components expand) (See FIG. 1B for axis references).

Furthermore, in variations where the electrodes contain conductive particles, like charges distributed across each electrode may cause conductive particles embedded within that electrode to repel one another, thereby contributing to the expansion of the elastic electrodes and dielectric films. In alternate variations, electrodes do not contain conductive particles (e.g., textured sputtered metal films). The dielectric layer 26 is thereby caused to deflect with a change in electric field. As the electrode material is also compliant, the electrode layers change shape along with dielectric layer 26. As stated hereinabove, deflection refers to any displacement, expansion, contraction, torsion, linear or area strain, or any other deformation of a portion of dielectric layer 26. This deflection may be used to produce mechanical work. As shown, the dielectric layer 26 can also include one or more mechanical output bars 34. The bars 34 can optionally provide attachment points for either an inertial mass (as described below) or for direct coupling to a substrate in the electronic media device.

In fabricating a transducer, an elastic film 26 can be stretched and held in a pre-strained condition usually by a rigid frame or stretch frame 8. In those variations employing a four-sided frame, the film can be stretched bi-axially. It has been observed that pre-strain improves the dielectric strength of the polymer layer 26, thereby enabling the use of higher electric fields and improving conversion between electrical and mechanical energy, i.e., the pre-strain allows the film to deflect more and provide greater mechanical work. Preferably, the electrode material is applied after pre-straining the polymer layer, but may be applied beforehand. The two electrodes provided on the same side of layer 26, referred to herein as same-side electrode pairs, i.e., electrodes on the top side of dielectric layer 26 and electrodes on a bottom side of dielectric layer 26, can be electrically isolated from each other. The opposed electrodes on the opposite sides of the polymer layer form two sets of working electrode pairs, i.e., electrodes spaced by the electroactive polymer film 26 form one working electrode pair and electrodes surrounding the adjacent exposed electroactive polymer film 26 form another working electrode pair. Each same-side electrode pair can have the same polarity, whereas the polarity of the electrodes of each working electrode pair is opposite each other. Each electrode has an electrical contact portion configured for electrical connection to a voltage source.

Examples of electroactive polymer films can be found in the commonly assigned patents and patent applications disclosed and incorporated by reference herein.

Figure 3:
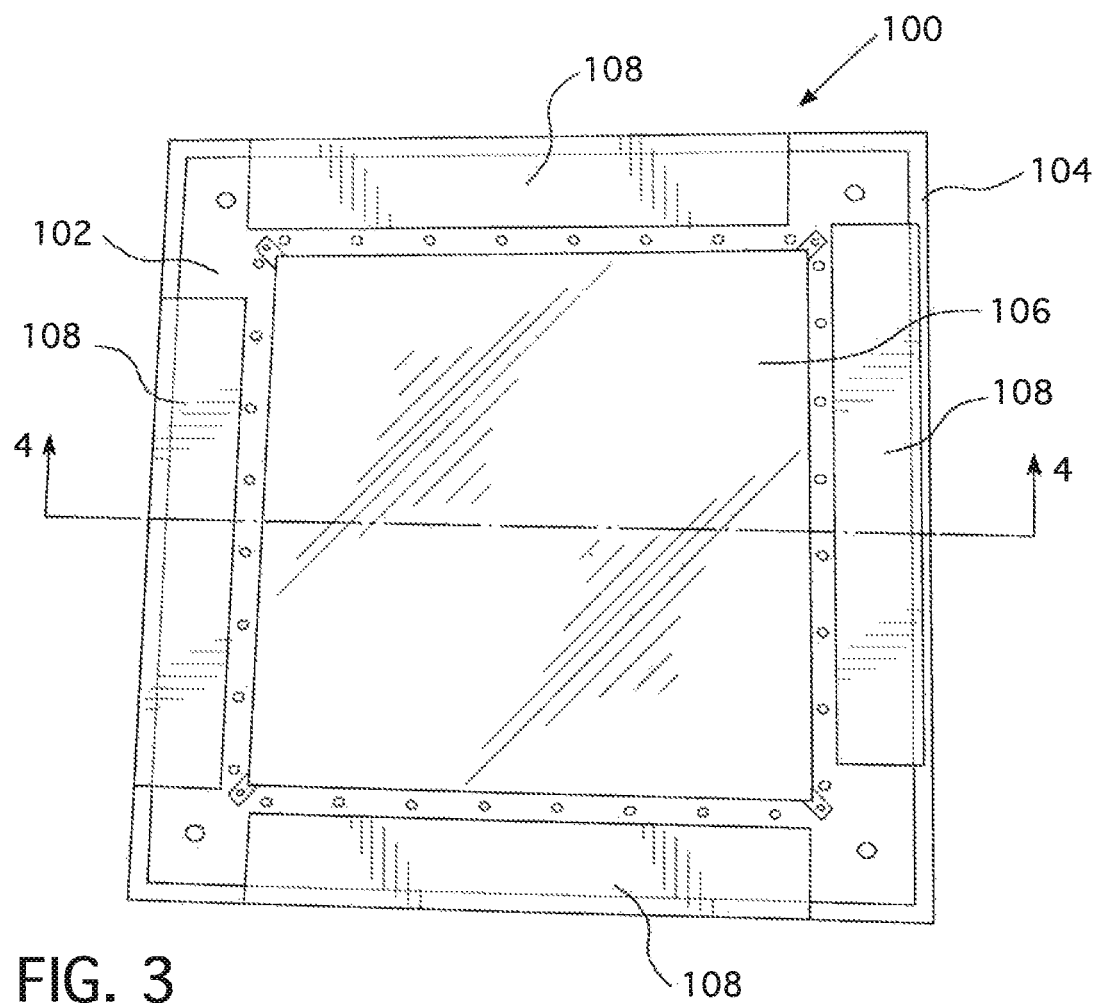
FIG. 3 illustrates a conventional stretch frame used in a conventional process.

Now turning to FIG. 3, where a conventional stretch frame 100 used in a conventional process is illustrated. As shown, the conventional stretch frame 100 includes a top frame element 102 and a bottom frame 104 element. The top frame element 102 is slightly smaller than the bottom frame element 104. With reference now to both FIGS. 3 and 4, a pre-strained dielectric film 106 is sandwiched between the top and bottom frame elements 102, 104 of the stretch frame 100. An adhesive tape 108 may be employed to bond the top and bottom frame elements 102, 104 together. This holds the pre-strained film 108 in place for subsequent lamination and printing processes. Once the printing process is completed, the individual electroactive polymer devices are removed, e.g., cut out (singulated), from the film 108 and removed from the stretch frame 100. The tape 108 and any film remnants must then be removed the stretch frame 100 before the stretch frame 100 can be reused. Removing the tape 108 and film remnants increases the manufacturing cycle time and adds labor costs for cleaning the stretch frame after each use. Although the top and bottom stretch frame elements 102, 104 can be made of any suitable materials such as metals and rigid plastics, generally these components are made of aluminum.

Figure 4:
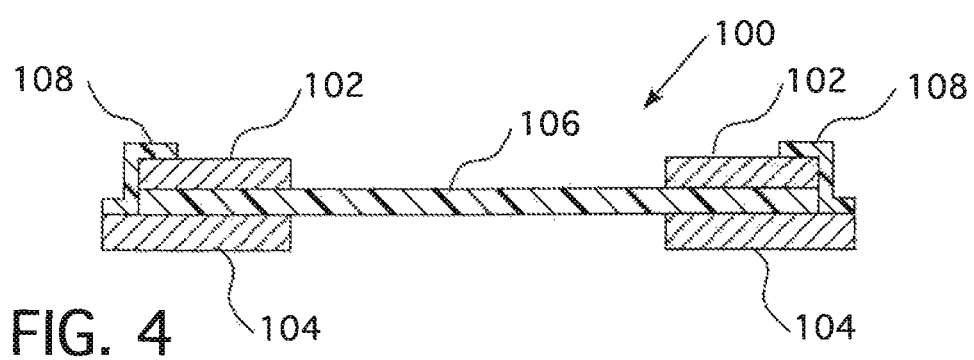
FIG. 4 illustrates a sectional view of the conventional stretch frame shown in FIG. 3 taken along section 4-4.
Figure 5:
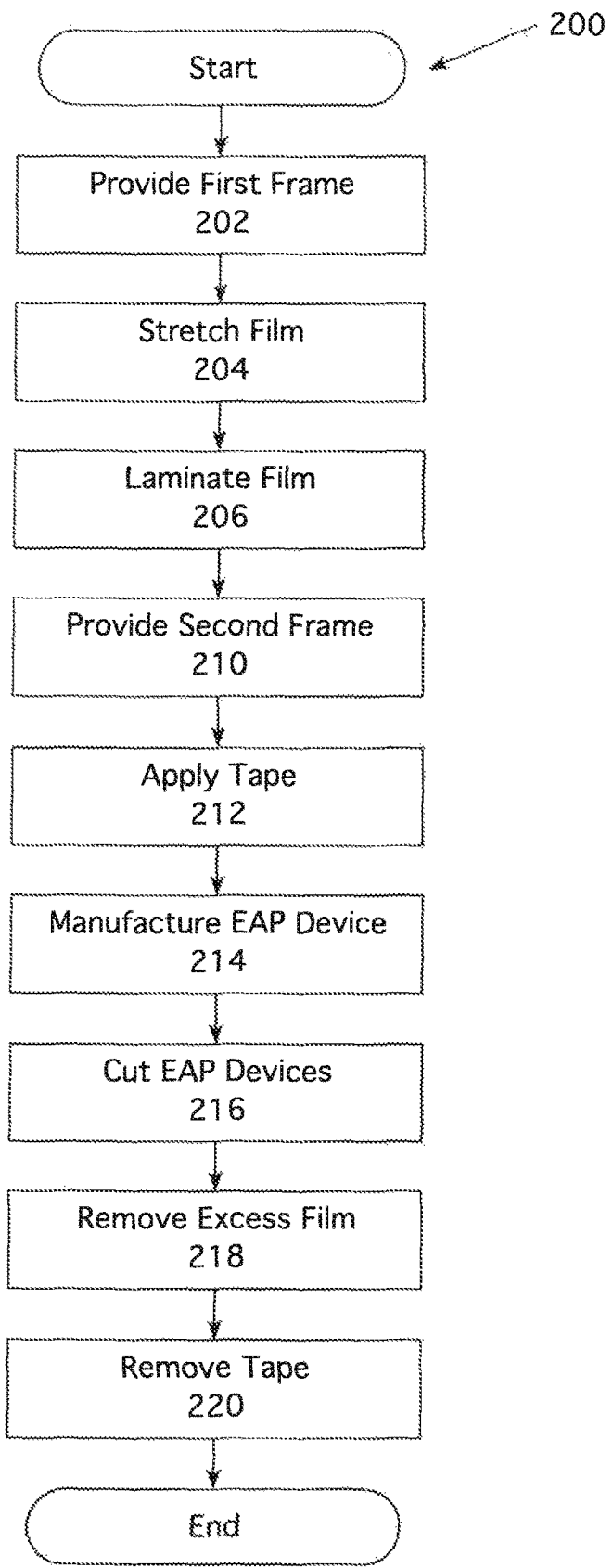
FIG. 5 illustrates a flow diagram of a conventional process for stretching and laminating film onto the conventional stretch frame shown in FIG. 4.

FIG. 5 illustrates a flow diagram 200 of a conventional process for stretching and laminating film onto the conventional stretch frame shown in FIG. 4. This process 200 will now be described in conjunction with FIGS. 3 and 4. The process 200 starts by providing 202 the bottom frame element 104. The film 106 is stretched 204 and laminated 206 onto the bottom frame element 104. The top frame element 102 is then provided and placed above the stretched film 106 and the bottom frame element 104. The tape 108 is applied to bond the top and bottom frame elements 102, 104 to hold the pre-strained film 108 during the manufacturing steps. The electroactive polymer devices are manufactured using the stretch frame 100. The devices are then removed 216 from the film 108. The excess film 108 is removed 218 and the tape 108 is removed and cleaned from the stretch frame 100.

Figure 6:
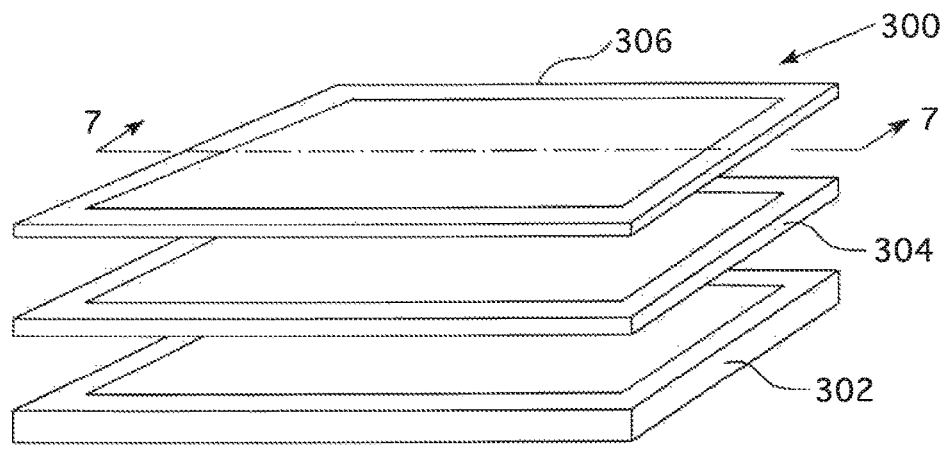
FIG. 6 illustrates an exploded view of a reusable stretch frame according to one embodiment of the present invention.
Figure 7:
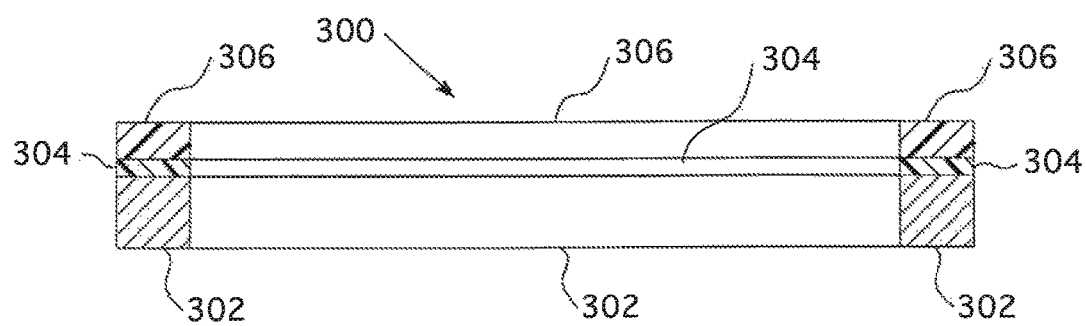
FIG. 7 illustrates a sectional view of the reusable stretch frame shown in FIG. 6 taken along section 7-7.

Having described the film stretching and laminating process for manufacturing electroactive polymer devices using a conventional stretch frame 100 and process 200, the disclosure now turns to FIG. 6, which illustrates an exploded view of a reusable stretch frame 300 according to one embodiment of the present invention and FIG. 7, which illustrates a sectional view of the stretch frame shown in FIG. 6 taken along section 7-7. As shown in FIGS. 6 and 7, the reusable stretch frame 300 according to one embodiment of the present invention comprises a bottom stretch frame element 302, a permanent, or long term, release coating 304 applied to a top portion of the stretch frame element 302, and a pressure sensitive adhesive 306 applied to the release coating 304. The release coating 304 is reusable and generally is applied once to the stretch frame element 302. Although the stretch frame element 302 can be made of any suitable material, the stretch frame element 302 is generally made of aluminum.

The reusable stretch frame 300 can be manufactured with thinner, narrower, stretch frame elements 302, which provides the additional advantage of increasing the pre-strained film 106 area available for printing the electroactive polymer components, for example. In other words, thinner or narrower stretch frame elements 302 increase the ratio of print area over the overall area defined by the stretch frame element 302.

Figure 8:
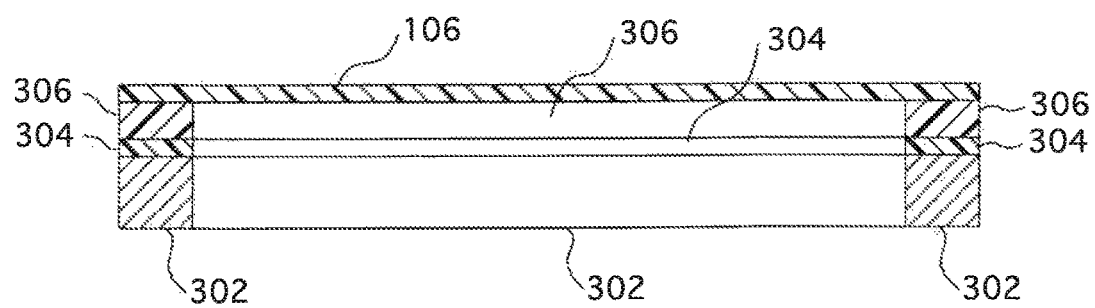
FIG. 8 illustrates a pre-strained film laminated onto a pressure sensitive adhesive coating applied to the reusable stretch frame shown in FIGS. 6 and 7 according to one embodiment of the present invention.

As shown in FIG. 8, the pre-strained film 106 is laminated onto the pressure sensitive adhesive material 306, which will hold the pre-strained film 106 during the electroactive polymer device manufacturing steps. Since the pre-strained film 106 is bonded to the stretch frame element 302 by the pressure sensitive adhesive 306, there is no need for a top stretch frame element 102 and tape 108 or other method to bond the top and bottom stretch frame elements 102, 104 as shown and described in connection with FIGS. 3 and 4.

Figure 9:
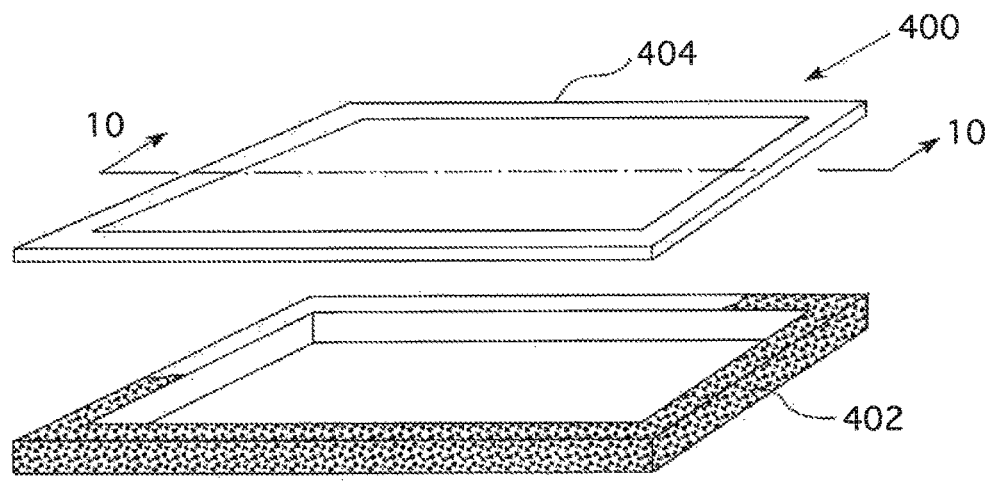
FIG. 9 illustrates an exploded view of a disposable stretch frame according to one embodiment of the present invention.
Figure 11:
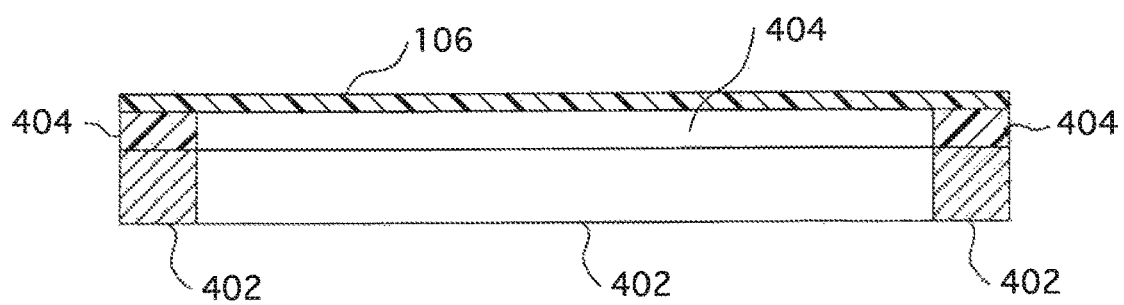
FIG. 11 illustrates a pre-strained film laminated onto a pressure sensitive adhesive coating applied to the disposable stretch frame shown in FIGS. 9 and 10 according to one embodiment of the present invention.

FIG. 9 illustrates an exploded view of a disposable stretch frame 400 according to one embodiment of the present invention. FIG. 10 illustrates a sectional view of the stretch frame shown in FIG. 8 taken along section 10-10. The disposable stretch frame 400 comprises a stretch frame element 402 made of relatively inexpensive material (e.g., plastic) to make it economically feasible to make it disposable. A pressure sensitive adhesive 404 coating is applied to a top portion of the stretch frame element 402 but no release coating is necessary since the disposable stretch frame 400 will not be reused. FIG. 11 illustrates a pre-strained film 106 laminated onto the pressure sensitive adhesive 404 coating applied to the stretch frame element 402.

Another embodiment of this invention is that at least a portion of the disposable stretch frame can be incorporated into the structure of the transducer cartridge. For example, an adhesive coated polyethylene terephthalate (PET) film with apertures could be laminated onto a pre-strained dielectric film, processed through printing stations to add electrodes, and singulated into individual transducers by die-cutting through the entire materials stack. Using the disposable stretch frame material in the final product could reduce product cost by eliminating the steps used to print a frame in an electroactive polymer cartridge.

Although the reusable and disposable stretch frames 300, 400 are illustrated as having a generally rectilinear shape, the shape of these stretch frames 300, 400 should not be limited as such. In general, the stretch frames 300, 400 may be implemented using any suitable triangular, square, rectangular, rhomboidal, polygonal, circular, oval, irregular, or other suitable shape.

Figure 12:
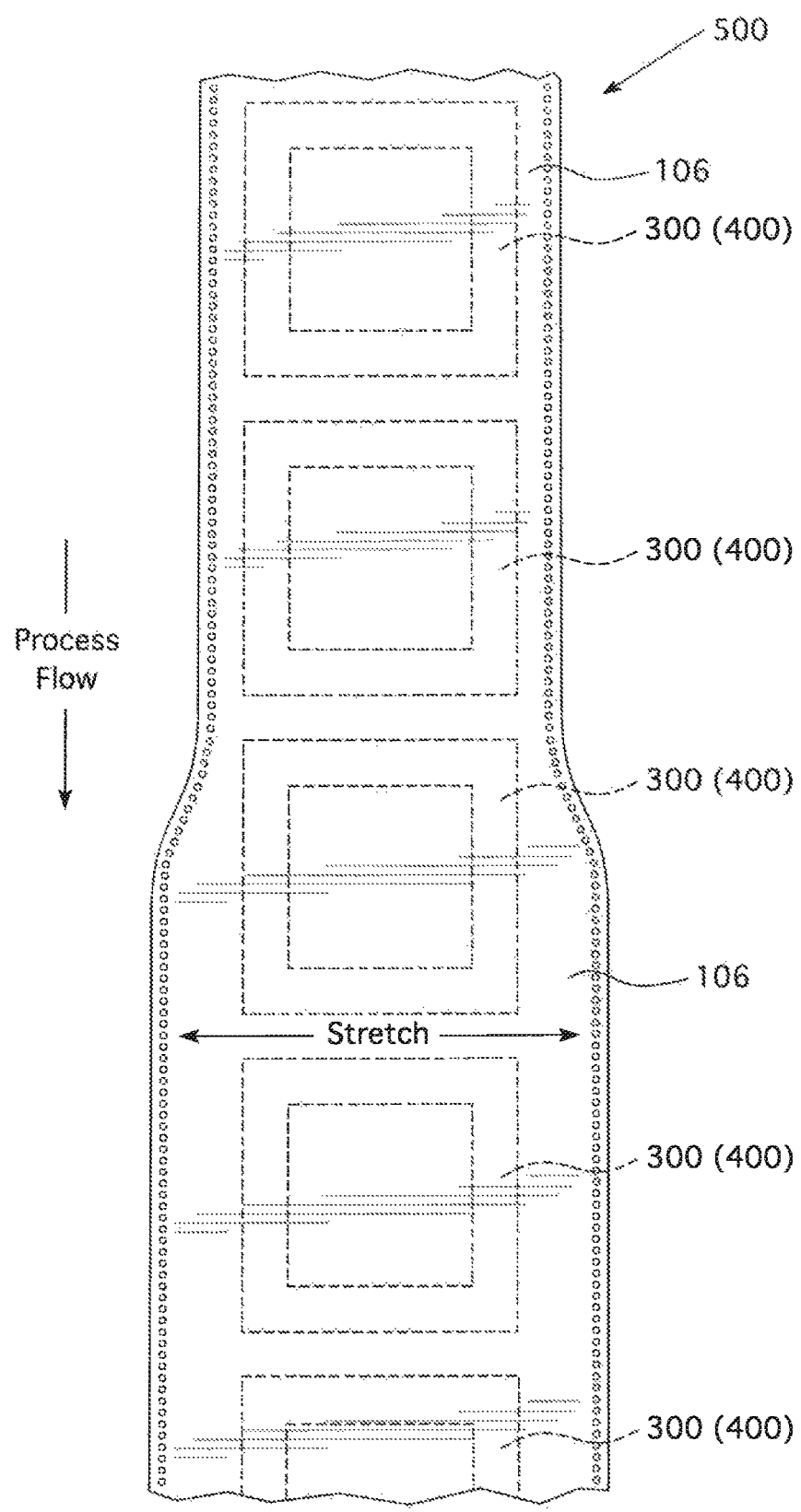
FIG. 12 illustrates a schematic diagram of a stretcher for stretching film and laminating the pre-strained film on stretch frames according to one embodiment of the present invention.

FIG. 12 illustrates a schematic diagram of a stretcher 500 for stretching film and laminating the pre-strained film on the stretch frames 300, 400 according to one embodiment of the present invention. The film 106 is initially rolled out and clamped on either side. As the film 106 advanced the clamps follow a track that widens and stretches the film 106. During the process, after the film 106 has been stretched, the film 106 is laminated onto the pressure sensitive adhesive coating applied to the reusable stretch frame 300 or the disposable stretch frame 400. After the pre-strained film 106 is laminated onto the stretch frames 300 (400), the frames are removed, e.g., cut out, from the film web and routed to an electroactive polymer device manufacturing stage, where the various components of the electroactive polymer device are printed or applied to the pre-strained film 106 bonded to the stretch frame 300 (400).

The cleaning process is simple. After the device or plurality of devices is removed from the pre-strained film 106, the pressure sensitive adhesive 306 and film remnants are peeled easily from the release coating 304. The reusable stretch frame 300 with the release coating 304 is reusable. For materials selection, consideration is given to the tack and peel adhesion properties of the pressure sensitive adhesive 306 as well as the release properties of the pressure sensitive adhesive 306. In other words, the pressure sensitive adhesive 306 should not be too easily released from the release coating 304 so it will remain during the manufacturing process, but should be easily released for the cleaning process. For making the release coating 306 permanent, an adhesion promoter can be applied to a portion of the stretch frame 300 prior to applying the release coating 304 thereon.

Various materials can be employed for the pressure sensitive adhesive 306 and the release coating 304. In one embodiment the pressure sensitive adhesive 306 is a Dow Corning 2013 (a solvent-free silicone pressure sensitive adhesive that, when used with SYL-OFF 4000 catalyst (a blend of platinum catalyst and vinyl functional silicone polymer), offers the ability to prepare pressure sensitive constructions at low curing temperatures) material, among other materials, for example; the release coating 304 is a Dow Corning SYL-OFF Q2-7785 (an 88% active solids dispersion of fluorofunctional silicone polymer in heptane), among other materials, for example; and optionally, an adhesion promoter for the release coating 304 to aluminum stretch frame 302 is NuSil CF2-135 (silicone primer), among other materials, for example.

Other materials that may be employed for the pressure sensitive adhesive 304 include: Dow Corning 280A (a dispersion of polydimethylsiloxane gum and resin diluted with xylene to 55% silicone solids content.), Dow Corning 282 (a dispersion of polydimethyldisiloxane gum and resin diluted with xylene to 55% silicone solids content), Dow Corning 7355 (a dispersion of polydimethylsiloxane gum and resin diluted with xylene and toluene to an average 56.5 percent silicone solids content), Dow Corning 7358 (a dispersion of polydimethylsiloxane gum and resin diluted with xylene and toluene to an average 56.5 percent silicone solids content), Dow Corning 7388 (a dispersion of polydimethylsiloxane gum and resin diluted with xylene to 55% to 58% silicone solids content), Dow Corning 7651, 7652, 7657, Dow Corning SYL-OFF Q2-7566 (a dispersion of polydimethylsiloxane gum and resin diluted with xylene to 55% silicone solids content), Dow Corning SYL-OFF Q2-7735 (a peroxide-curable silicone pressure sensitive adhesive designed to provide low, stable release from liners made with Dow Corning SYL-OFF Q2-7785 Release Coating, while maintaining high subsequent tack and adhesion properties; the adhesive is a dispersion of siloxane gum and silicone resin diluted with xylene to 55% silicone solids content), Dow Corning SYL-OFF Q2-7406 (a polydimethylsiloxane gum and resin dispersion), Momentive SILGRIP PSA529 (silicone pressure sensitive adhesive), Momentive SILGRIP PSA590 (a silicone pressure sensitive adhesive based on a toluene solution of polysiloxane gum and resin and supplied at 60% silicone solids and may be further diluted with aromatic, aliphatic or chlorinated solvents), Momentive SILGRIP PSA595 (a silicone pressure sensitive adhesive based on a xylene solution of polysiloxane gum and resin and supplied at 55% silicone solids and may be further diluted with aromatic, aliphatic or chlorinated solvents), Momentive SILGRIP PSA6573A (a silicone pressure sensitive adhesive based on a toluene solution of polysiloxane gum and resin and supplied at 60% silicone solids and may be further diluted with aromatic, aliphatic or chlorinated solvents), Momentive SILGRIP PSA6574 (a silicone pressure sensitive adhesive based on a toluene solution of phenyl based polysiloxane gum and resin supplied at 55% silicone solids and may be further diluted with aromatic, aliphatic or chlorinated solvents), NuSil PSA-1170 (a silicone based pressure sensitive adhesive), among other materials, for example. Other adhesives may also be employed that are not pressure sensitive adhesives such as hot-melt, liquid, thermal curing, UV curing, and B-staged adhesives. A wide range of adhesives can be used including silicones, fluorosilicones, acrylates, polyurethanes, olefins, hydrocarbon rubbers, styrene copolymers, epoxies, hot-melt adhesives, pressure sensitive adhesives, thermal curing adhesives, UV curing adhesives, liquid adhesives, and any combinations thereof, among other materials.

Materials that may be employed for the release coating 304 include: Momentive FSR2000 (a fluorosilicone polymer containing platinum catalyst), epoxy silicone, fluoropolymer, fluorosilicone, among other materials, for example. The choice of the release coating is highly dependent on the materials used for the stretch frame, adhesive, and stretched dielectric film.

Additional materials that have been tested but have not performed as well as the above listed materials for a silicone film design include, for the release coating 304: Magnaplate coatings including polymer-based LECTROFLUOR, TUFRAM surface enhancement coating, and TEFLON (polytetrafluoroethylene (PTFE) synthetic fluoropolymer of tetrafluoroethylene), mold release, EASE RELEASE 200, among other materials. These materials may find utility for other chemistries, however.

Portions of the surface of the stretch frame may be pre-treated prior to the application of the release coating to improve the formation and adhesion of a strong, durable release coating. Treatment agents include solvents, primers, coupling agents, and etchants. An exemplary adhesion promoter for a fluorosilicone release coating 304 to the aluminum stretch frame 302 is NuSil MED1-161 (silicone primer specially formulated primer designed for use with platinum-cured systems where conventional silicone primers are insufficient.

Figure 13:
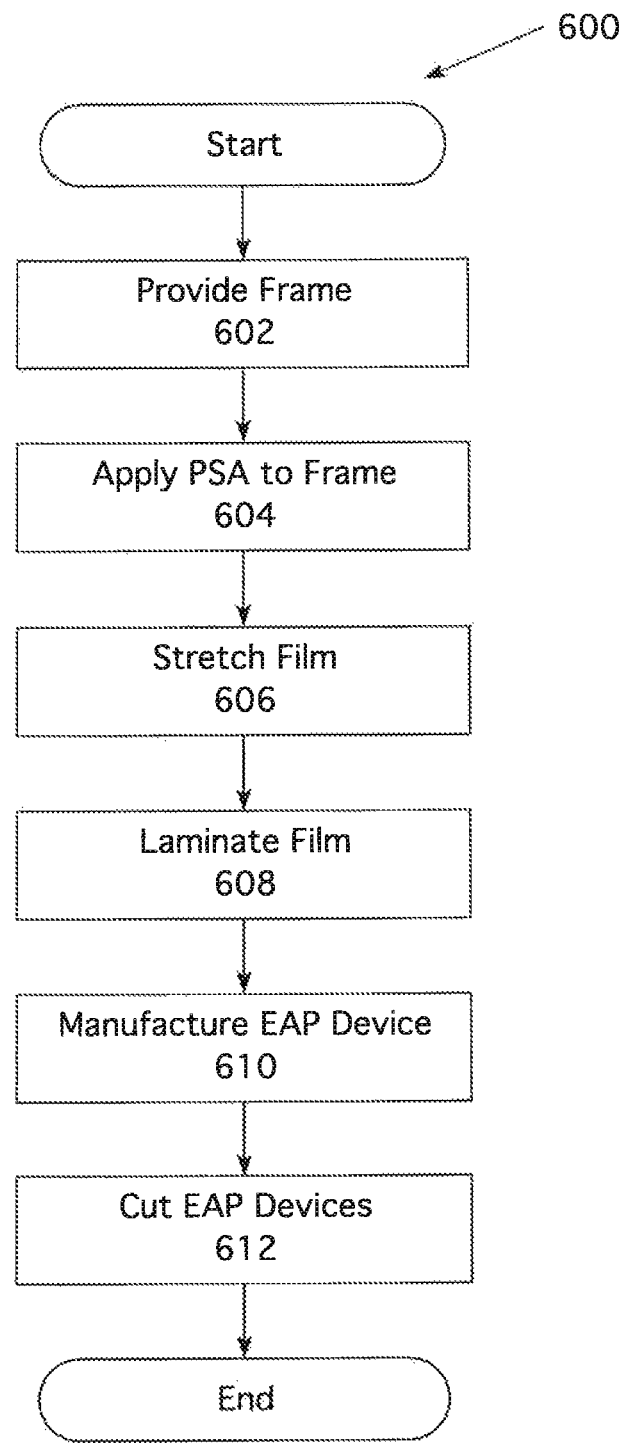
FIG. 13 illustrates a flow diagram of a film stretching and laminating process according to one embodiment of the present invention.

FIG. 13 illustrates a flow diagram 600 of a film stretching and laminating process according to one embodiment of the present invention. As shown in FIG. 13, a stretch frame 300 (400) is provided 602 and a pressure sensitive adhesive 306 is applied thereto. In one embodiment, the reusable stretch frame 300 is made of aluminum, or other reusable material. The release coating 304 is applied to the aluminum reusable stretch frame 300 prior to its introduction into the process depicted in the flow diagram 600. When a disposable stretch frame 400 is employed, then the pressure sensitive adhesive 306 can be applied directly to the disposable stretch frame 400 material. Once the pressure sensitive adhesive 306 coating is applied, the film 106 stretched and the pre-strained film 106 is laminated onto the stretch frame 300 (400). After lamination the stretch frame 300 (400) with the pre-strained film 106 is employed to manufacture 610 the electroactive polymer devices as described in connection with FIGS. 1A, 1B, 2A, 2B. The devices are then removed, e.g., cut 612, from the pre-strained film 106 bonded to the stretch frame 300 (400) by the pressure sensitive adhesive 306. When a reusable stretch frame 300 is employed, the excess film 106 and the pressure sensitive adhesive 306 are simply peeled away from the release coating 304, making clean up easy and preparation of the stretch frame 300 for the next process run more efficient. When a disposable stretch frame 400 is employed, the entire stretch frame 400 is disposed of.

Figure 14:
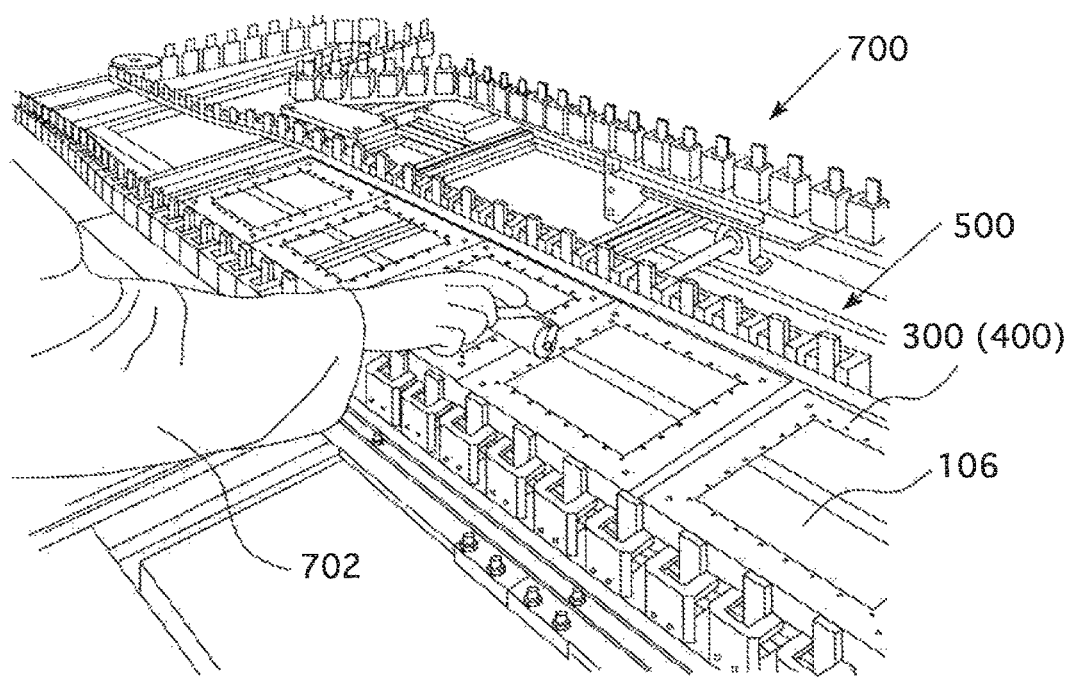
FIG. 14 illustrates one embodiment of a semiautomatic stretcher being used to stretch film and to laminate the stretched film onto a stretch frame according to one embodiment of the present invention.

FIG. 14 illustrates one embodiment of a semiautomatic stretcher 700 being used to stretch film 106 and to laminate the stretched film 106 onto a stretch frame 300 (400) according to one embodiment of the present invention. The semiautomatic stretcher 700 is being used to stretch the film 106 and for film-frame lamination on the film stretcher 500 (as shown in FIG. 12). As shown in FIG. 14, an operator 702 is in the process of laminating the film 106 onto the frames 300 (400) that were coated with the pressure sensitive adhesive 306, as described in connection with FIGS. 6-8. Although a manual lamination process is shown, embodiments of the present invention encompass a fully automatic process where a roller or other means are employed to perform the lamination function. Also, the film 106 stretcher 500 can be advanced continuously or indexed by a single frame 300 (400) or a predetermined number of frames 300 (400).

Figure 15:
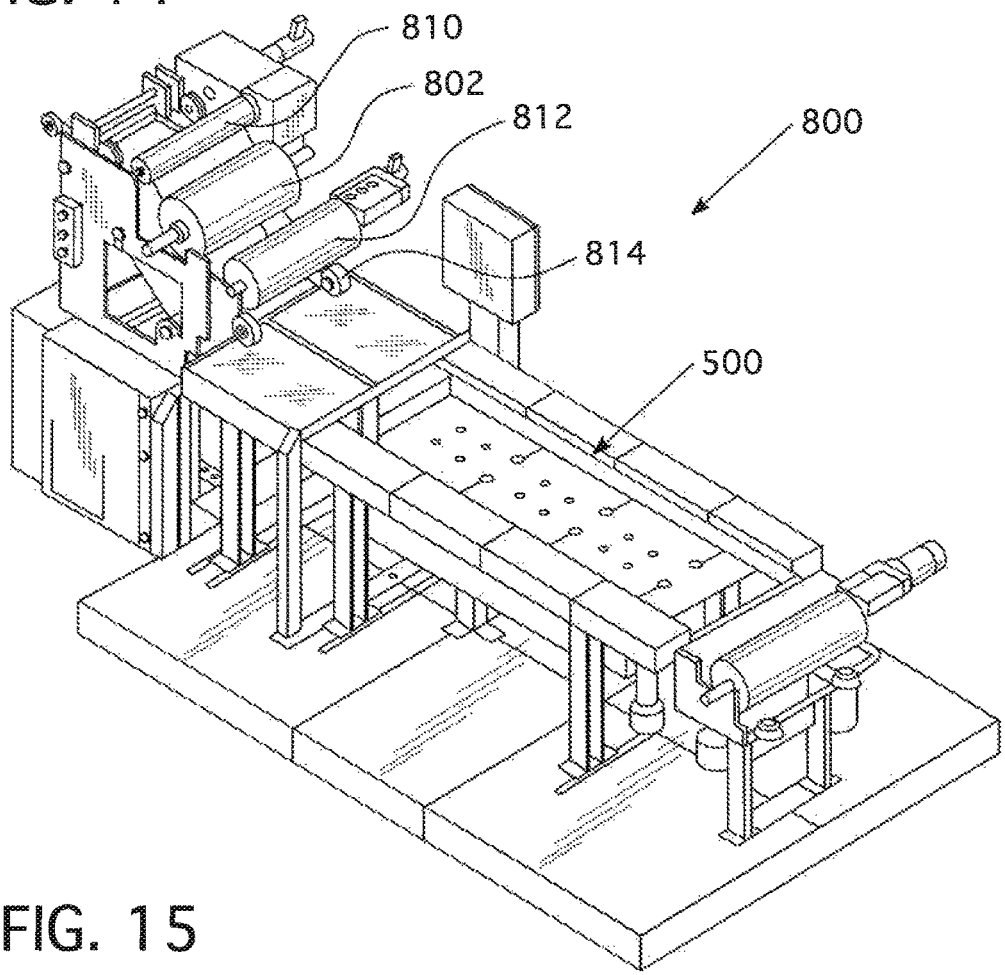
FIG. 15 illustrates one embodiment of a semiautomatic stretcher for stretching film and laminating the stretched film onto a stretch frame according to one embodiment of the present invention.
Figure 16:
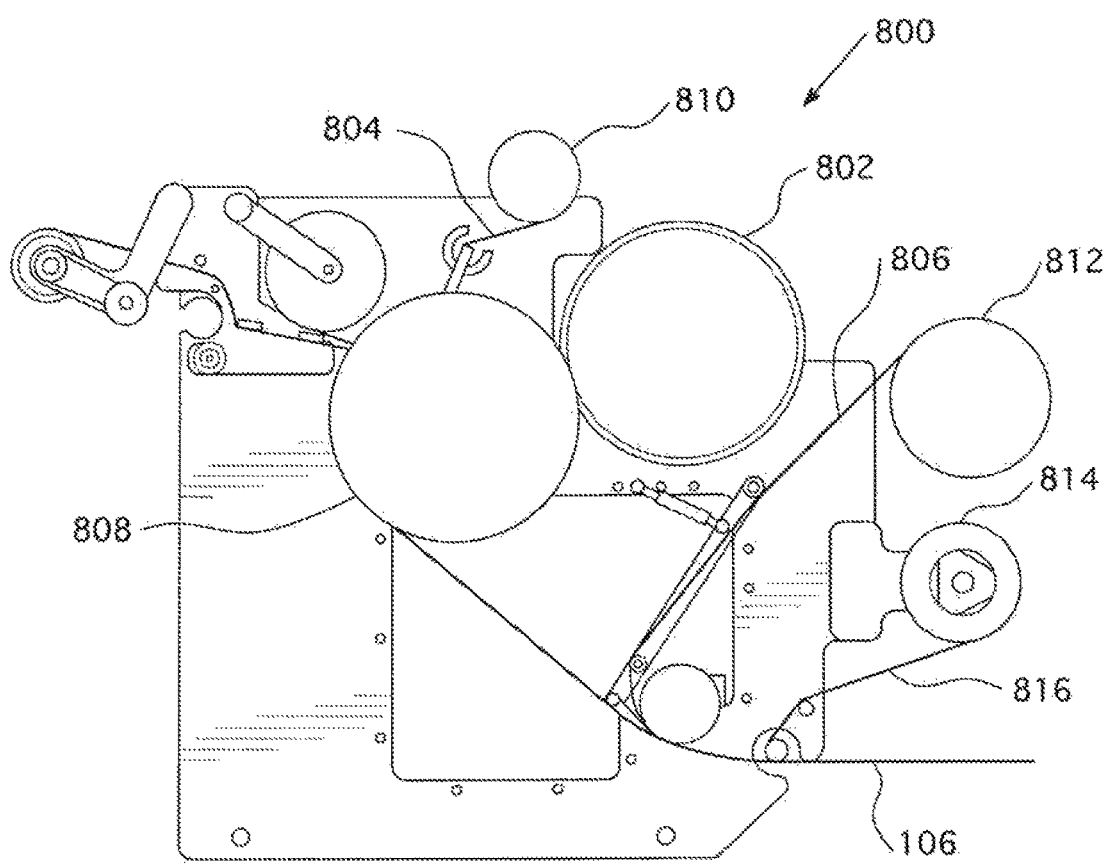
FIG. 16 illustrates a side view of the semiautomatic stretcher shown in FIG. 15.

FIG. 15 illustrates one embodiment of a semiautomatic stretcher 800 for stretching film 106 with the film stretcher 500 (as shown in FIG. 12) and laminating the stretched film 106 onto a stretch frame 300 (400) according to one embodiment of the present invention. FIG. 16 illustrates a side view of the semiautomatic stretcher 800. With reference now to FIGS. 15, and 16, the semiautomatic stretcher 800 comprises a base material roll 802, a machine direction orientation roll 808, a first scrap winder 810, and a second scrap winder 812. The base material roll 802 comprises a dielectric film 106 layer sandwiched between a polyethylene terephthalate layer 804 and a polyethylene (PE) interleave layer 806. In operation, as the base material roll 802 rotates the polyethylene terephthalate layer 804 is wound by the first scrap winder 810 and the PE interleave layer 806 is wound by the second scrap winder 812. The dielectric film layer 106 is advanced to the film stretcher 500 portion. A tape unwind spool 814 can be employed to apply tape 816 to the edges of the edges of the dielectric film 106 to reinforce the film 106 during the stretching phase.

As previously discussed, the various embodiments of the stretch frames 300 (400) and process 601) for stretching and laminating the film 106 onto the stretch frames 300 (400) provide several advantages over the conventional stretch frame 100 and process 200. Such advantages include, without limitation, cost reduction, improved lamination integrity, enables use of narrower frames to increase the film area available for printing, efficient use of silicone film, and increase throughput. Also, printing after the lamination process becomes easier with thinner stretch frames.

As for other details of the present invention, materials and alternate related configurations may be employed as within the level of those with skill in the relevant art. The same may hold true with respect to process-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

What is claimed is:

1. A method of fabricating a polymer film device, the method comprising:
    providing an apparatus comprising:
        a stretch frame; and
        an adhesive applied to at least a portion of the stretch frame, wherein the adhesive is configured to bond a pre-strained film tightly to the stretch frame during a manufacture of electroactive polymer devices and further configured to enable an easy removal of film remnants left on the stretch frame after the electroactive polymer devices are removed from the stretch frame;
    providing a film;
    stretching the film;
    laminating or bonding the pre-strained film onto the adhesive coating of the stretch frame;
    manufacturing the electroactive polymer device on the pre-strained film; and
    removing the electroactive polymer devices from the pre-strained film bonded to the stretch frame by the adhesive.

2. The method according to claim 1, further comprising incorporating at least a portion of the stretch frame into the electroactive polymer device.

3. The method according to claim 1, further comprising applying a release coating onto at least a portion of the stretch frame and applying the adhesive coating on top of the release coating.

4. A method of fabricating a polymer film device, the method comprising:
    providing an apparatus comprising:
        a stretch frame; and
        an adhesive applied to at least a portion of the stretch frame, wherein the adhesive is configured to bond a pre-strained film tightly to the stretch frame during a manufacture of electroactive polymer devices and further configured to enable an easy removal of film remnants left on the stretch frame after the electroactive polymer devices are removed from the stretch frame;
    providing a film;
    stretching the film;
    laminating or bonding the pre-strained film onto the adhesive coating of the stretch frame;
    applying a release coating onto at least a portion of the stretch frame and applying the adhesive coating on top of the release coating; and
    applying an adhesion promoter to at least a portion of the stretch frame prior to applying the release coating thereon.

5. The method according to claim 3, further comprising reusing the stretch frame by removing at least a portion of the pre-strained film from the release coating.

* * * * *